US006950326B2

(12) United States Patent
Suzuki

(10) Patent No.: US 6,950,326 B2

(45) Date of Patent: Sep. 27, 2005

(54) SEMICONDUCTOR MEMORY DEVICE

(75) Inventor: Hideaki Suzuki, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/644,040

(22) Filed: Aug. 20, 2003

(65) Prior Publication Data

US 2004/0037132 A1 Feb. 26, 2004

(30) Foreign Application Priority Data

Aug. 21, 2002 (JP) ....................................... 2002-241109

(51) Int. Cl.[7] ................................................ G11C 11/22

(52) U.S. Cl. ................................... 365/145; 365/230.03

(58) Field of Search ................................. 365/145, 203, 365/139, 233, 230.03

(56) References Cited

U.S. PATENT DOCUMENTS 6,446,177 B1 * 9/2002 Tanaka et al. .............. 711/163

* cited by examiner

*Primary Examiner*—Thong Q. Le

(74) *Attorney, Agent, or Firm*—Arent Fox PLLC

(57) ABSTRACT

After a read operation is conducted to a memory area designated by an address in response to a combination of a data destructive signal and a chip select signal, a bit line is pre-charged with a ground potential and an electric potential of a plate line is lowered, thereby stopping the data from being written back to an area in which the data is destroyed by the read operation. The electric potential of the word line may be kept at VDD level without boosting it to a potential for writing back the data. The bit line may be clamped to the ground potential, thereby stopping the read data from being output to an outside of a memory device to stop an operation of a sense amplifier.

20 Claims, 24 Drawing Sheets

PRIOR ART

PRIOR ART

SEMICONDUCTOR MEMORY DEVICE

CROSS-REFERENCE TO RELATED APPLICATIONS

This application is based upon and claims the benefit of priority from the prior Japanese Patent Application No.2002-241109, filed on Aug. 21, 2002, the entire contents of which are incorporated herein by reference.

BACKGROUND OF THE INVENTION

1) Field of the Invention

The present invention relates to a semiconductor memory device that consists of a ferroelectric memory.

2) Description of the Related Art

A ferroelectric memory is a nonvolatile memory that uses a ferroelectric material for a capacitor film and that stores data by the residual polarization of the ferroelectric material. Since it is unnecessary to use a power supply to hold data, the ferroelectric memory may be applied to a storage device that stores and holds data in an IC card. In the future, multi-purpose IC card obtained by incorporating various applications into a single IC card may be considered. In a multi-purpose IC card of this type, a storage device that consists of a ferroelectric memory (hereinafter "FeRAM") is considered to be used not only for storing data but also as an application working area.

The flow of the data read processing of a conventional FeRAM is shown in FIG. 1. Namely, data is read from a memory cell to a bit line (step S241), the read data is amplified by a sense amplifier (step S242), the amplified data is output to the outside (step S243), data destructed as a result of data read is written back to the memory cell (step S244), and the bit line is pre-charged with a ground potential to thereby initialize the bit line (step S245). The data write-back operation at the step S244 is referred to as "restore".

FIG. 2 is a timing diagram for the data read processing of the conventional FeRAM. As shown in FIG. 2, during data reading, an electric potential of a pre-charge signal /PRC is set at a logically low potential level (hereinafter "L level") and the electric potential of a word line (WL) and that of a plate line driving signal PLCLK are set at a logically high potential level (hereinafter "H level").

When a sense amplifier driving signal SACLK is set at H level, then the potentials of a pair of bit lines BL and /BL are sensed and the potentials of the bit lines BL and /BL are defined. Thereafter, the voltage of the word line (WL) is boosted to a higher voltage and data is restored. The electric potential of the pre-charge signal /PRC is returned to H level, and the bit lines BL and /BL are pre-charged and initialized.

FIG. 3 shows the configuration of a circuit that boosts the voltage of the word line (WL) in the conventional FeRAM. FIG. 4 is a timing diagram that shows the operation of the circuit shown in FIG. 3. As shown in FIGS. 3 and 4, a first MOS transistor 1 is activated in response to a signal WLBOOT that boots the word line (WL), and an H-level word line enable signal WLE is supplied from a word line driving circuit that is not shown. A second MOS transistor 2 is then activated.

As a result, a signal WLCLOCK supplied from the word line driving circuit, not shown, is supplied to the word line (WL) as a word line driving clock signal WLCLK at the level of a positive power supply potential (hereinafter "VDD") through a buffer 3, thus charging the word line (WL) almost to the VDD Level. A capacitor 4 that serves as a coupling capacitance is connected to the word line (WL). During a restore operation, a driving signal BOOSTCLK for this capacitor 4 becomes H level and the voltage of the word line (WL) is boosted by capacitance coupling.

In relation to the configuration of the FeRAM, there are two types of word line (WL)-plate line combinations as follows. The first is a one-to-one correspondence type, i.e., a word line WL1 corresponds to a plate line PL1 and a word line WL2 corresponds to a plate line PL2 as shown in FIG. 5. The second is a type that word lines WL1 and WL2 share the plate line PL1 as shown in FIG. 6. FIG. 7 is a circuit diagram that shows the configuration of a circuit that controls word line selection in a conventional plate line shared type FeRAM. FIG. 8 is a timing diagram that shows the operation of the circuit shown in FIG. 7.

As shown in FIGS. 7 and 8, when a block select signal BLOCKSEL becomes H level and an address select signal ADDR_SEL becomes H level, then the output signal of a first NAND gate 10 that inputs the block select signal and the address select signal becomes L level and the output signal is supplied to a first NMOS transistor 11 as an L-level gate signal WLPC1.

In addition, the output signal of the first NAND gate 10 is inverted by a first inverter 12, and the inverted signal is supplied to a third NMOS transistor 14 as an H-level gate signal WLSEL1 GT when a second NMOS transistor 13 inputs the H-level WLBOOT signal and is turned on. The third NMOS transistor 14 is, therefore, turned on. At this moment, when the H-level WLCOCK signal is supplied to the drain of the third NMOS transistor 14 from the word line driving circuit, not shown, a word line driving clock signal WLCLK1L at VDD level is output from the source of the third NMOS transistor 14 to the first word line of the paired word lines that share one plate line. That is, the first word line is selected.

On the other hand, since the address select signal ADDR_SEL is at H level, an address select signal /ADDR_SEL obtained by inverting the address select signal ADDR_SEL becomes L level. The output signal of a second NAND gate 15 that inputs the L-level address select signal ADDR_SEL and the H-level block select signal BLOCKSEL, becomes H level. Therefore, an H-level gate signal WLPC2 is supplied to the gate of a fourth NMOS transistor 16 from the second NAND gate 15, thus turning on the fourth NMOS transistor 16. When this fourth NMOS transistor 16 is turned on, the electric potential of a word line driving clock signal WLCLK2L for the second word line of the paired word lines that share one plate line becomes a ground potential, thus turning the second word line into an unselected state.

At this moment, the output signal of the second NAND gate 15 is inverted by a second inverter 17 and the output signal becomes L level. This L-level signal is supplied to a sixth NMOS transistor 19 as a gate signal WLSEL2GT when a fifth NMOS transistor 18 inputs the H-level WLBOOT signal and is turned on. As a result, the sixth NMOS transistor 19 is turned off, thereby preventing the H-level WLCOCK signal supplied from the word line driving circuit, not shown, from being output as the word line driving clock signal WLCLKI2L for the second word line.

As explained above, the FeRAM may be used as an application working area in a multi-purpose IC card or the like in the future. When so, even though the operation of an application is finished and the supply of power that has been supplied to the FeRAM during the operation is stopped, data being subjected to the operation remains in the FeRAM. To prevent unintended data from being leaked from this working area, it is necessary to delete unnecessary data or overwrite meaningless data so as to destruct the unnecessary data. This disadvantageously requires complicated procedures. Further, since the latch of the sense amplifier is inverted when inverting and restoring an arbitrary bit of data, power is disadvantageously, wastefully consumed.

There is conventionally known a system for securing safety by presetting the upper limit of a failure frequency for access authentication and recording an access authentication failure frequency so as to prevent data from being accessed by illegal means. However, since this upper limit may possibly be manipulated, this conventional system is not always omnipotent.

SUMMARY OF THE INVENTION

It is an object of the present invention to at least solve the problems in the conventional technology.

According to one aspect of the present invention, there is provided an FeRAM wherein after a read operation is conducted to a memory area designated by an address, a bit line is pre-charged with a ground potential and then an electric potential of a plate line is lowered, thereby stopping the data from being written back to an area the data of which is destroyed by the read operation. In the FeRAM, the electric potential of the word line may be kept at VDD Level without boosting it to a potential for writing back the data. Alternatively, the bit line is clamped to the ground potential, thereby stopping the read data from being output to the outside to stop the operation of the sense amplifier.

According to the above aspect, although the data in the memory area from which the data is read is destroyed by the data read operation, the destroyed data is not written back after the data read operation. Therefore, the data in the memory area remains destroyed. In addition, the boosting of the voltage of the word line and the operation of the sense amplifier are stopped, making it possible to suppress the power consumption of the memory device.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 27 is a typical diagram that shows one example of applying the present invention to the realization of function of restricting an effective frequency for access or the like;

DETAILED DESCRIPTION

Exemplary embodiments of the present invention are explained hereinafter in detail with reference to the accompanying drawings.

Figure 9:
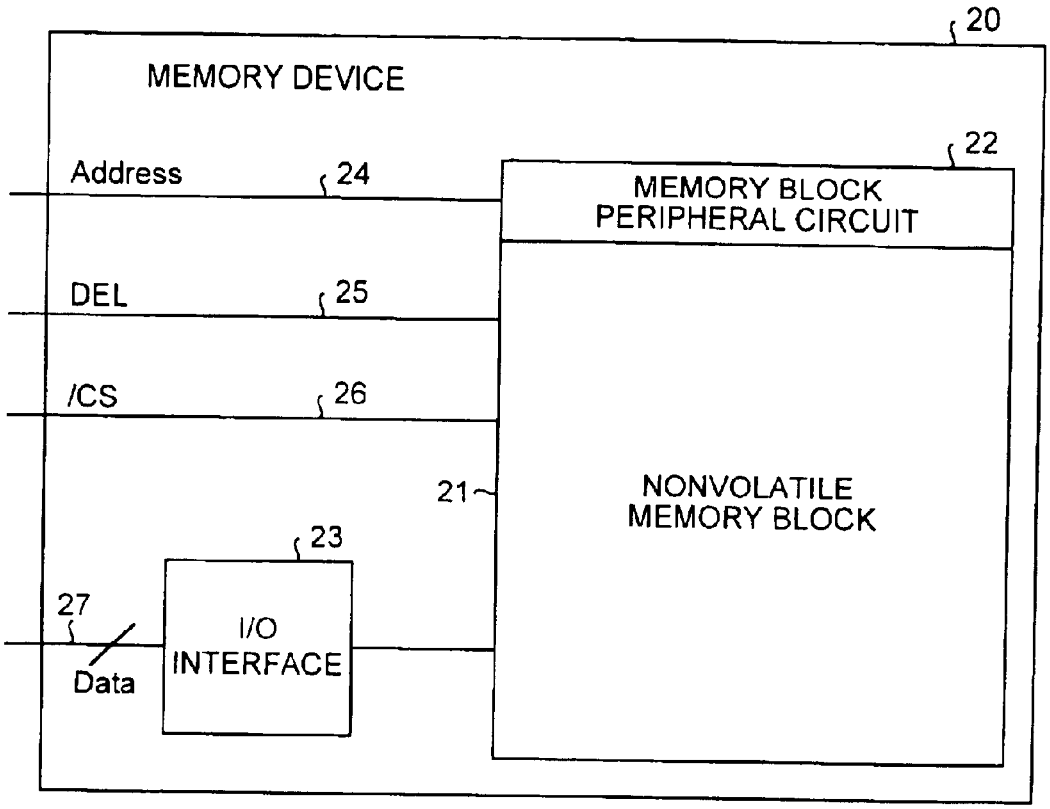
FIG. 9 is a schematic diagram that shows the overall configuration of a semiconductor memory device according to the present invention.

FIG. 9 is a schematic diagram that shows the overall configuration of a semiconductor memory device according to the present invention. This memory device (that is, a semiconductor memory device) 20 includes a nonvolatile memory block 21 that consists of a ferroelectric memory, a memory block peripheral circuit 22 that consists of, for example, an X decoder circuit, a Y decoder circuit, a sense amplifier and the like to control a data write operation, a data read operation, a data deletion operation or the like for the memory block 21, and an I/O Interface 23 for the input/output of data to and from the memory block 21. In addition, the semiconductor memory device 20 includes various control signal lines, respectively, and a data bus 27. An address signal is input into a control signal line 24, a data destructive signal DEL is input into a control signal line 25, and a chip select signal /CS is input into a control signal line 26, are input from the outside of the semiconductor memory device 20.

Figure 10:
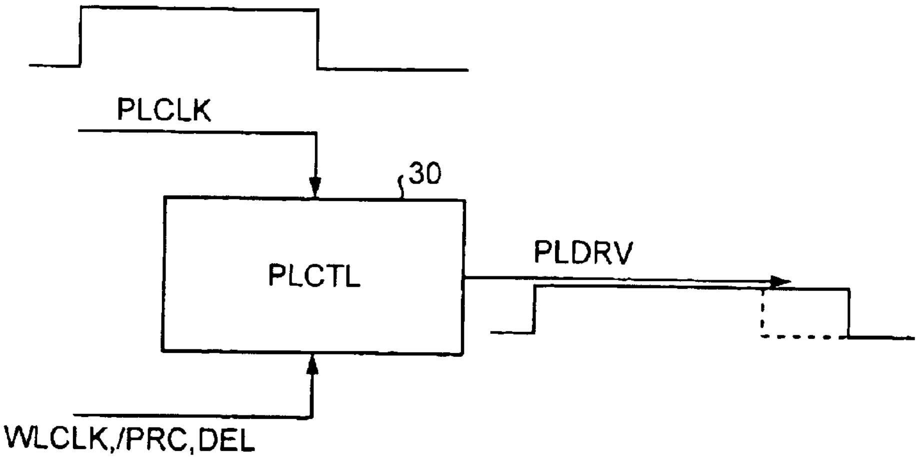
FIG. 10 explains the function of a plate line control circuit of the semiconductor memory device according to the present invention.

FIG. 10 explains the function of a plate line control circuit that drives a not shown plate line of the semiconductor memory device 20. A plate line control circuit (PLCTL) 30 generates a new plate line driving signal PLDRV using the plate line driving signal PLCKL, the word line driving clock signal WLCLK, and the pre-charge signal /PRC used in the conventional FeRAM and based on these signals as well as the data destructive signal DEL. The plate line is driven by this new plate line driving signal PLDRV, and data is destroyed. Therefore, the plate line control circuit 30 functions as a data destruction unit.

The new plate line driving signal PLDRV is later in falling timing than the conventional plate line driving signal PLCLK, so that the new plate line driving signal PLDRV falls after a bit line is pre-charged with a ground potential. Whether the falling timing of the new plate line driving signal PLDRV is the same as or later than that of the conventional plate line driving signal PLCLK indicated by a broken line in FIG. 10 is controlled based on the data destructive signal DEL.

Figure 11:
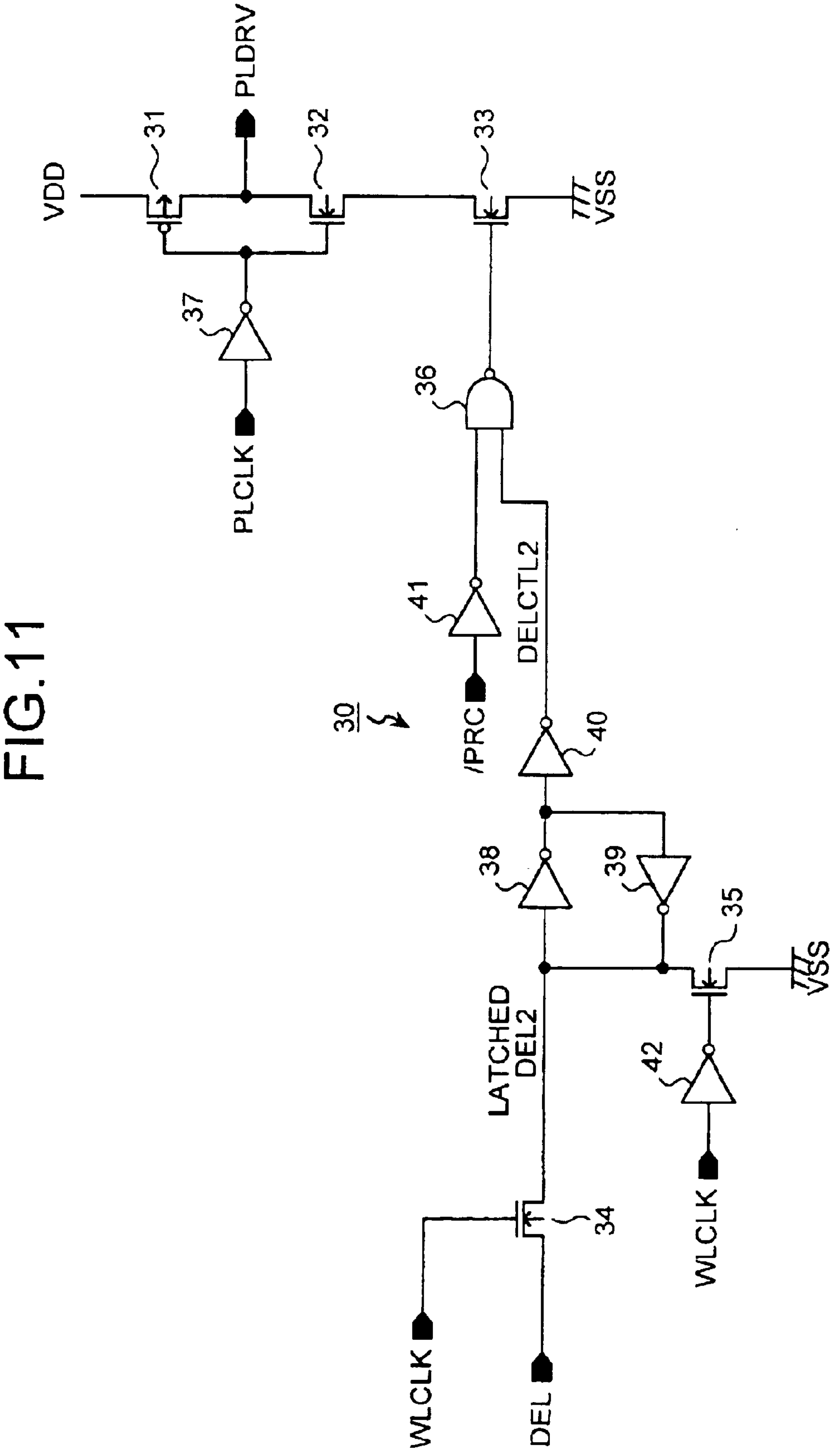
FIG. 11 is a circuit diagram that shows one example of the configuration of the plate line control circuit of the semiconductor memory device according to the present invention.

FIG. 11 is a circuit diagram that shows one example of the configuration of the plate line control circuit 30. The plate line control circuit 30 includes, for example, one PMOS transistor 31, four NMOS transistors 32, 33, 34, and 35, a NAND gate 36, and six inverters 37, 38, 39, 40, 41, and 42. The conventional plate line driving signal PLCLK is inverted by the first inverter 37, and input into an inverter circuit that consists of the PMOS transistor 31 and the first NMOS transistor 32. The new plate line driving signal PLDRV is output from this inverter circuit.

The source of the first NMOS transistor 32 is connected to the drain of the second NMOS transistor 33. The source electric potential of the second NMOS transistor 33 is equal in level to a negative power supply potential or ground potential (to be referred to as "VSS" hereinafter). Therefore, when the second NMOS transistor 33 is turned on, the new plate line driving signal PLDRV is equal to the conventional plate line driving signal PLCLK. That is, the timing at which the new plate line driving signal PLDRV rises becomes equal to the timing at which the conventional plate line driving signal PLCLK indicated by the broken line in FIG. 10 rises.

The on/off switching of the second NMOS transistor 33 is controlled based on the data destructive signal DEL. The data destructive signal DEL is fetched into the plate line control circuit 30 when the third NMOS transistor 34 is turned on, and the data destructive signal DEL thus fetched is latched by the second inverter 38 and the third inverter 39. The on/off switching of the third NMOS transistor 34 is controlled based on the word line driving clock signal WLCLK.

The latched signal LATCHED_DEL2 is inverted by the fourth inverter 40. This inverted signal DELCTL2 and a signal obtained by inverting the pre-charge signal /PRC by the fifth inverter 41 are input into the NAND gate 36. The output signal of this NAND gate 36 is input into the gate of the second NMOS transistor 33 so as to control the on/off switching of the second NMOS transistor 33.

The signal LATCHED_DEL2 latched by the second inverter 38 and the third inverter 39 is reset to VSS level when the fourth NMOS transistor 35 is turned on. The on/off switching of the fourth NMOS transistor 35 is controlled based on a signal obtained by inverting the word line driving clock signal WLCLK by the sixth inverter 42.

Figure 12:
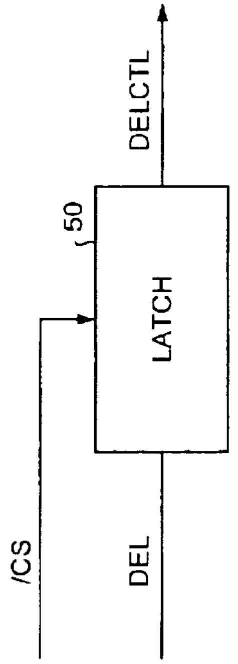
FIG. 12 explains the function of a data destructive signal latch circuit of the semiconductor memory device according to the present invention.

FIG. 12 explains the function of a circuit that latches the data destructive signal DEL so as to control whether the data read from the memory device 20 is to be output to the outside of the memory device 20. As shown in FIG. 12, the data destructive signal latch circuit 50 latches the data destructive signal DEL based on the chip select signal /CS, and outputs the latched signal as a read operation control signal DELCTL.

Figure 13:
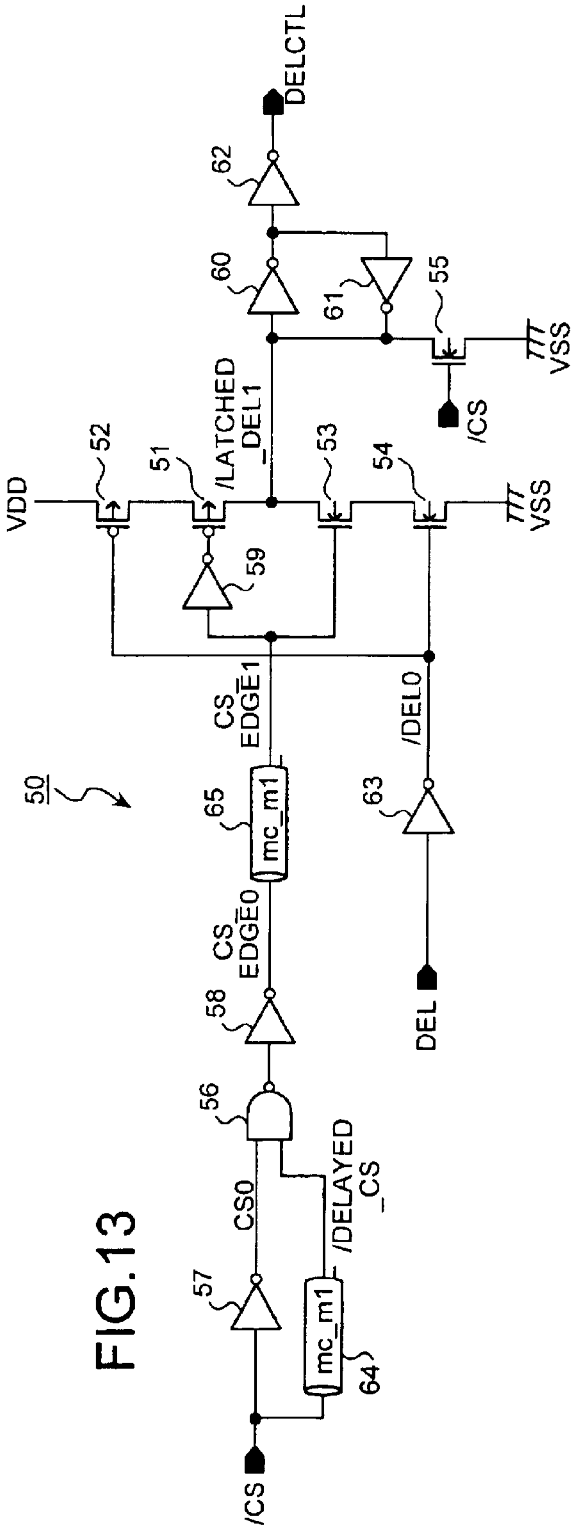
FIG. 13 is a circuit diagram that shows one example of the configuration of the data destructive signal latch circuit of the semiconductor memory device according to the present invention.

FIG. 13 is a circuit diagram that shows one example of the configuration of the data destructive signal latch circuit 50. As shown in FIG. 13, the data destructive signal latch circuit 50 includes, for example, two PMOS transistors 51 and 52, three NMOS transistors 53, 54, and 55, a NAND gate 56, seven inverters 57, 58, 59, 60, 61, 62, and 63, and two delay lines 64 and 65.

The chip select signal /CS input into the data destructive signal latch circuit 50 is inverted by the seventh inverter 57. The inverted signal CS0 as well as a signal /DELAYED_CS obtained by delaying the chip select signal /CS by the first delay line 64 is input into the second NAND gate 56. The output signal of the second NAND gate 56 is inverted by the eighth inverter 58. The inverted signal CS_EDGED0 is delayed by the second delay line 65.

The signal CS_EDGE1 delayed by the second delay line 65 is inverted by the ninth inverter 59, and input into the gate of the second PMOS transistor 51 and into the gate of the fifth NMOS transistor 53. The source of the second NMOS transistor 51 and the source of the fifth NMOS transistor 53 are connected to each other, and a signal /LATCHED_DEL1 output from the common node is latched by the tenth inverter 60 and the eleventh inverter 61. The latched signal is inverted by the twelfth inverter 62, and output as a read operation control signal DELCTL.

The source electric potential of the second PMOS transistor 51 becomes VDD Level when the third PMOS transistor 52 is turned on. The source electric potential of the fifth NMOS transistor 53 becomes VSS level when the sixth NMOS transistor 54 is turned on. The on/off switching of the third PMOS transistor 52 and that of the sixth NMOS transistor 54 are controlled based on a signal /DEL0 obtained by inverting the data destructive signal DEL by the thirteenth inverter 63.

The signal /LATCHED_DEL1 latched by the tenth inverter 60 and the eleventh inverter 61 is reset to VSS level when the seventh NMOS transistor 55 is turned on. The on/off switching of the seventh NMOS transistor 55 is controlled based on the chip select signal /CS.

Figure 14:
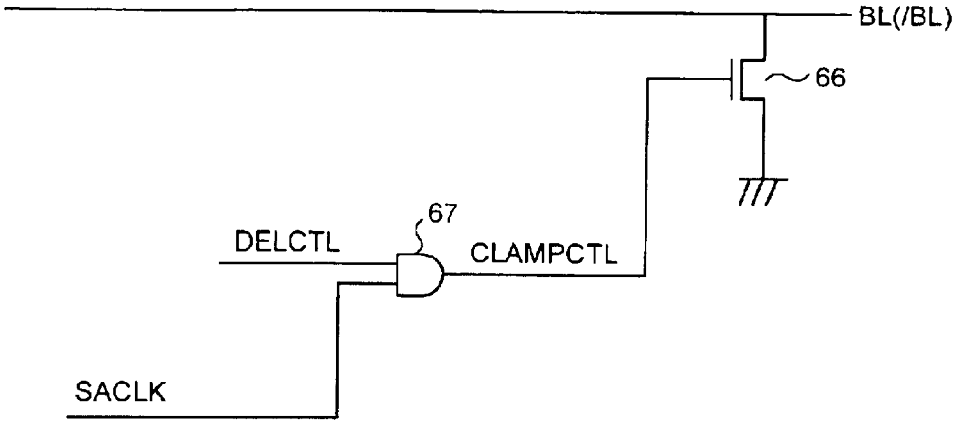
FIG. 14 is a circuit diagram that shows one example of a bit line clamp circuit of the semiconductor memory device according to the present invention.

FIG. 14 is a circuit diagram that shows one example of the configuration of a circuit that clamps the electric potential of a bit line so as not to output the data read from the memory device 20 to the outside of the memory device 20. As shown in FIG. 14, a pre-charge eight NMOS transistor 66 is connected to the bit line BL or /BL. The on/off switching of this NMOS transistor 66 is controlled based on a clamp control signal CLAMPCTL.

The clamp control signal CLAMPCTL is output from an AND gate 67 that inputs the read control signal DELCTL output from the data destructive signal latch circuit 50, and a sense amplifier driving signal SACLK used in the conventional FeRAM. During data read, when the bit line BL or /BL is clamped, the read data is not output to the outside of the memory device 20. Therefore, the eighth NMOS transistor 66 and the AND gate 67 function as a data output stopping unit. It is noted that a signal that drives the word line or the plate line may be used in place of the sense amplifier driving signal SACLK used in the conventional FeRAM.

Figure 15:
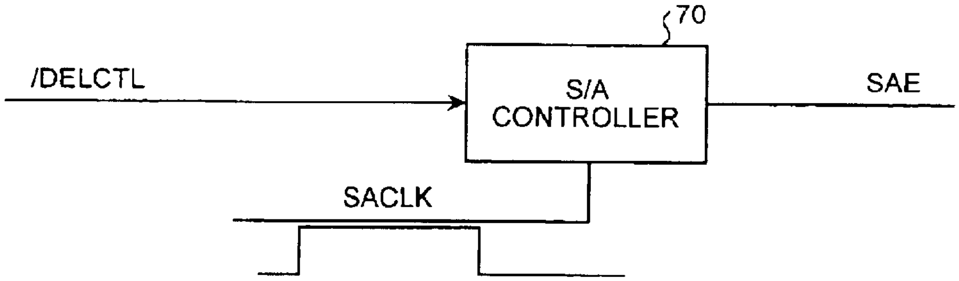
FIG. 15 explains the function of a circuit that controls the operation of a sense amplifier of the semiconductor memory device according to the present invention.

FIG. 15 explains the function of a circuit that controls the sensing operation of the sense amplifier. As shown in FIG. 15, the sense amplifier control circuit (S/A controller) 70 ANDs, for example, the inverted signal /DELCTL of the read operation control signal DELCTL and the sense amplifier driving signal SACLK used in the conventional FeRAM, and outputs the AND result as a sense amplifier enable signal SAE. The sense amplifier enable signal SAE is supplied to a sense amplifier driving circuit, not shown, thereby driving the sense amplifier. Therefore, the sense amplifier controller 70 functions as a sensing stopping unit.

Figure 3:
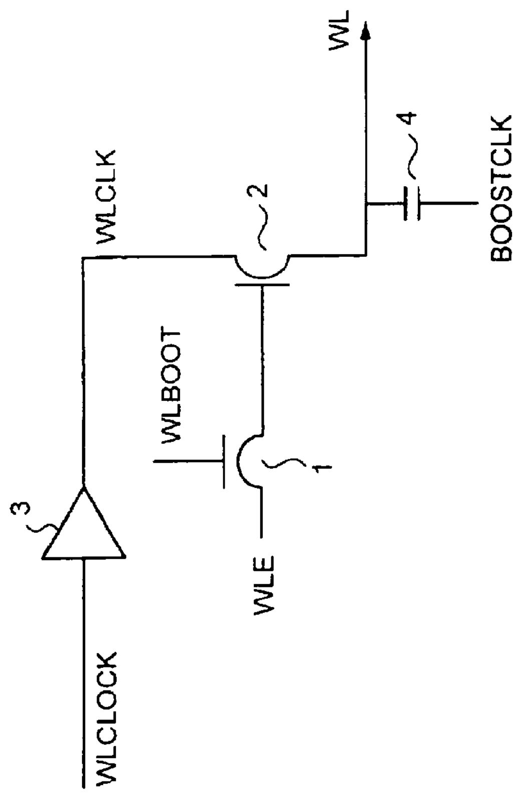
FIG. 3 is a circuit diagram that shows the configuration of a circuit that boosts the voltage of a word line in the conventional FeRAM.
Figure 4:
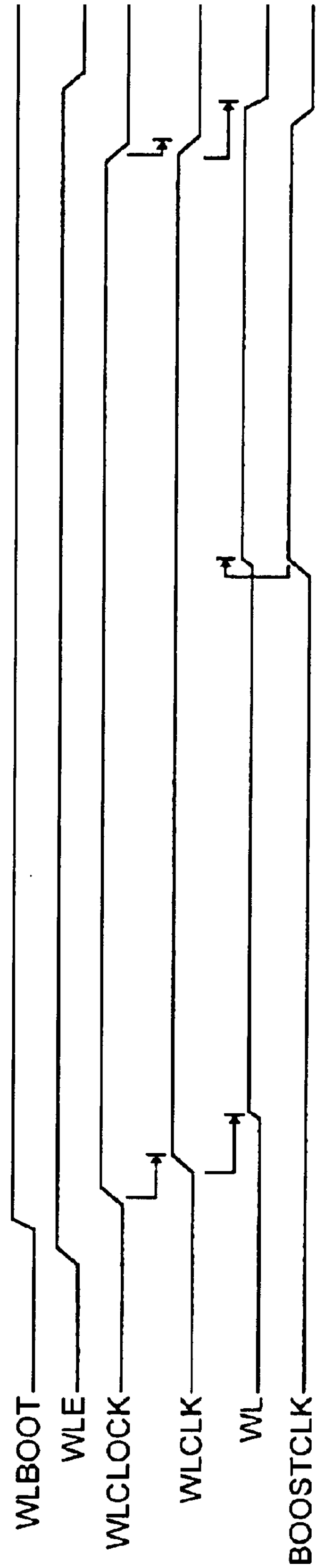
FIG. 4 is a timing diagram that shows the operation of the circuit shown in FIG. 3.
Figure 5:
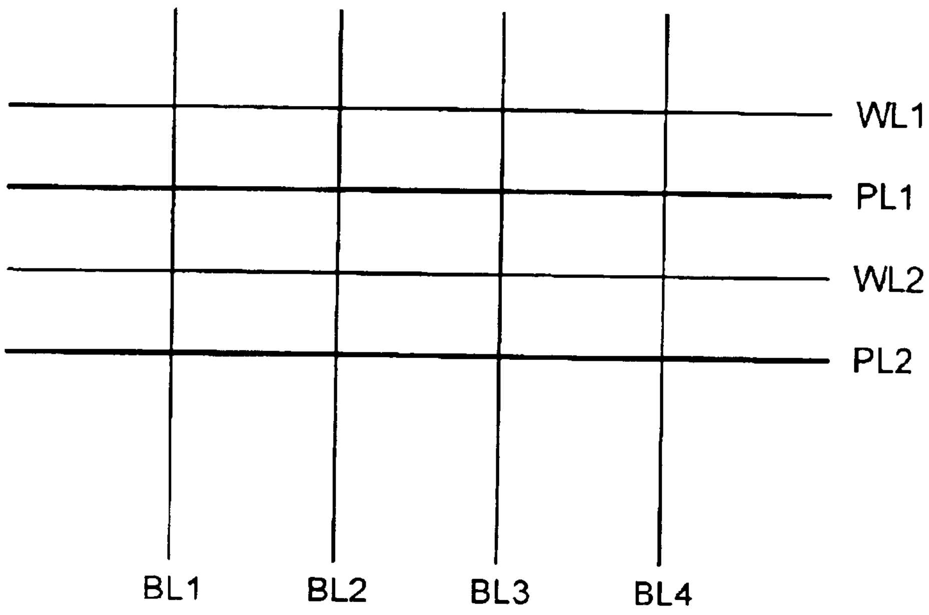
FIG. 5 is a typical diagram that shows an FeRAM of such type that a word line corresponds to a plate line by a one-to-one correspondence.
Figure 6:
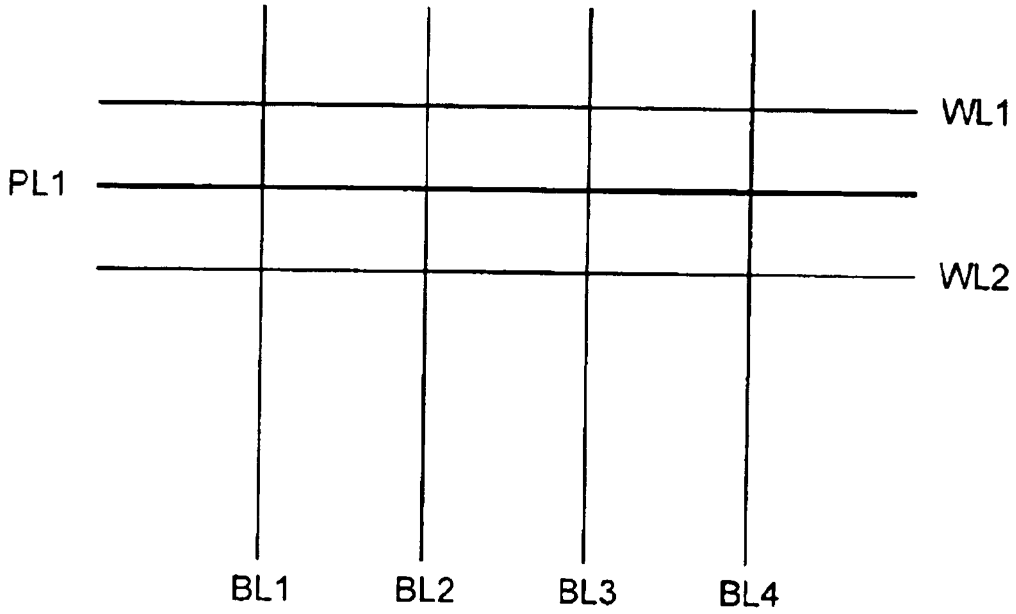
FIG. 6 is a typical diagram that shows an FeRAM of such type that one plate line is shared between two word lines.
Figure 16:
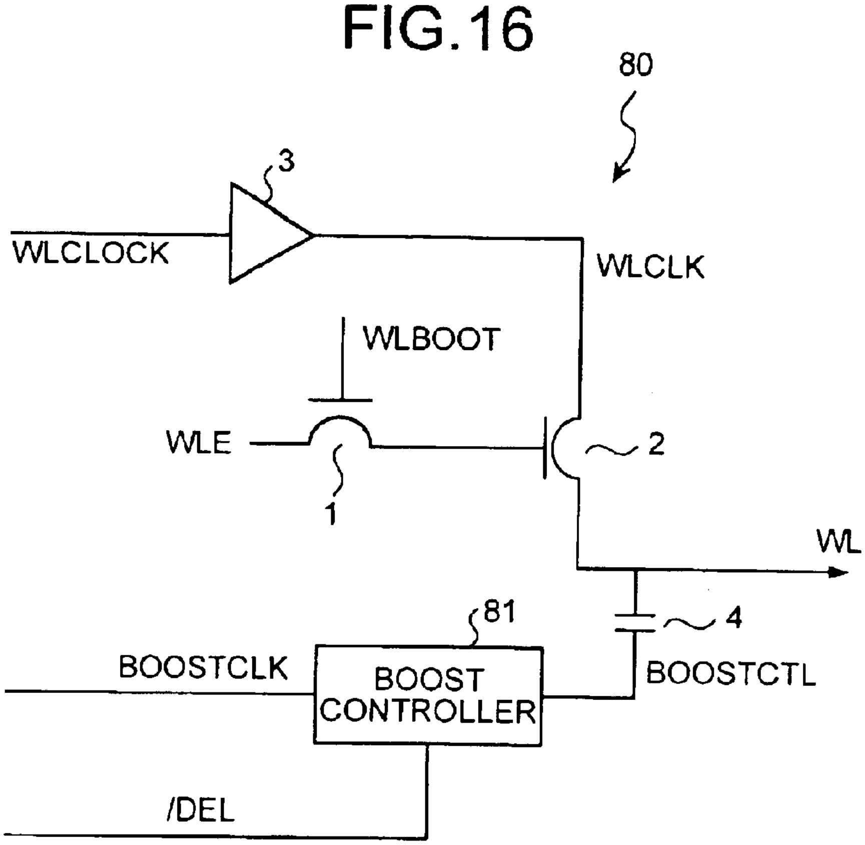
FIG. 16 is a circuit diagram that shows one example of a circuit that boost-controls the voltage of a word line of the semiconductor memory device according to the present invention.

FIG. 16 is a circuit diagram that shows one example of the configuration of a circuit that boost-controls the voltage of the word line (WL). As shown in FIG. 16, the word line boost control circuit 80 in this embodiment includes a boost control circuit (BOOST controller) 81 as well as the constituent elements of the conventional circuit (see FIG. 3). In FIG. 16, the same constituent elements as those shown in FIG. 3 are denoted by the same reference symbols, and their explanation has been omitted. The boost controller 81 ANDs the signal BOOSTCLK used in the conventional FeRAM for driving the capacitor 4 that serves as a coupling capacitance and the inverted signal /DEL of the data destructive signal DEL, and outputs the AND result as a new driving signal BOOSTCTL for the capacitor 4. Therefore, the boost controller 81 functions as a boost stopping unit.

Figure 17:
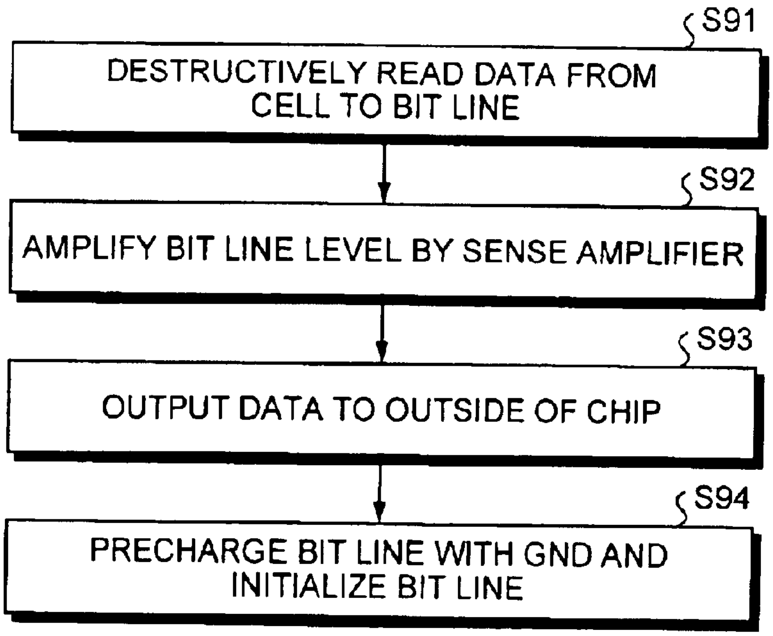
FIG. 17 is a flow chart that shows the processing of the semiconductor memory device according to the present invention when read data is output to the outside and data is not restored.

The operations of the memory device 20 thus constituted is explained. The operation of the memory device 20 for outputting the data read from the memory device 20 to the outside and destroying the data in a memory area from which the data is read (which operation is referred to as "Case 1" hereinafter) is explained. As shown in FIG. 17, the Case 1 has the following sequence. Data is read from a memory cell to the bit line (at step S91), amplified by the sense amplifier (at step S92), and output to the outside of the memory device 20 (at step S93). Thereafter, before the electric potential of the plate line is lowered, the bit line is pre-charged with the ground potential (GND) and thereby initialized (at step S94).

The operation timings of the Case 1 is explained. In this embodiment, it is assumed herein, though not limited thereto, that when the data destructive signal DEL is at L level, an ordinary operation, i.e., an operation for restoring data following read data is performed.

Figure 18:
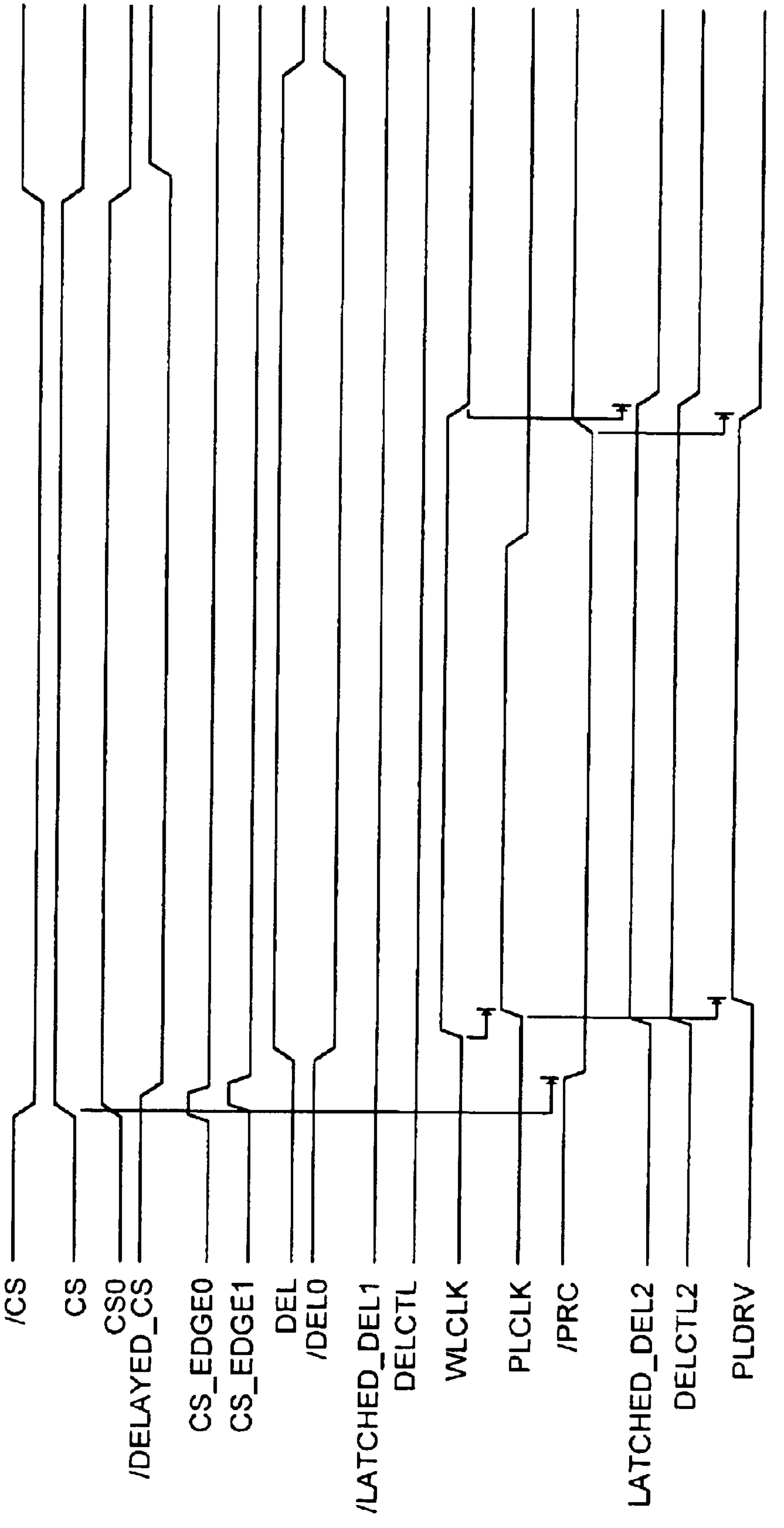
FIG. 18 is a timing diagram for the processing of the semiconductor memory device according to the present invention when read data is output to outside and data is not restored.

FIG. 18 is a timing diagram of the Case 1 (see FIGS. 11 and 13 for the explanation of the various signals). As shown in FIG. 18, the chip select signal /CS, which is low active, is changed from H level to L level. Accordingly, the pre-charge signal /PRC is changed from H level to L level. The data destructive signal DEL, the read operation control signal DELCTL, the word line driving clock signal WLCLK, the conventional plate line driving signal PLCLK, and the new plate line driving signal PLDRV remain L level.

The data destructive signal DEL is then changed to H level. The word line driving clock signal WLCKL is changed to H level, and the H-level data destructive signal LATCHED_DEL2 is latched. In addition, the conventional plate line driving signal PLCLK is changed to H level, and the new plate line driving signal PLDRV is also changed to H level. Data read is thus performed.

When data read is finished, the conventional plate line driving signal PLCLK is changed to L level. However, since the plate line control circuit 30 latches the H-level data destructive signal LATCHED_DEL2 while the word line driving clock signal WLCLK is at H level, the new plate line driving signal PLDRV remains H level. During this time, the bit line is pre-charged with the ground potential. The pre-charge signal /PRC is then returned to H level. Accordingly, the new plate line driving signal PLDRV is returned to L level. Namely, the bit line is initialized before the electric potential of the plate line is lowered, so that data is not restored.

Thereafter, the word line driving clock signal WLCLK is changed to L level, and the latched H-level data destructive signal LATCHED_DEL2 is reset to L level. The chip select signal /CS is returned to H level, and the data destructive signal DEL is returned to L level, thus finishing the Case 1 operation.

Figure 19:
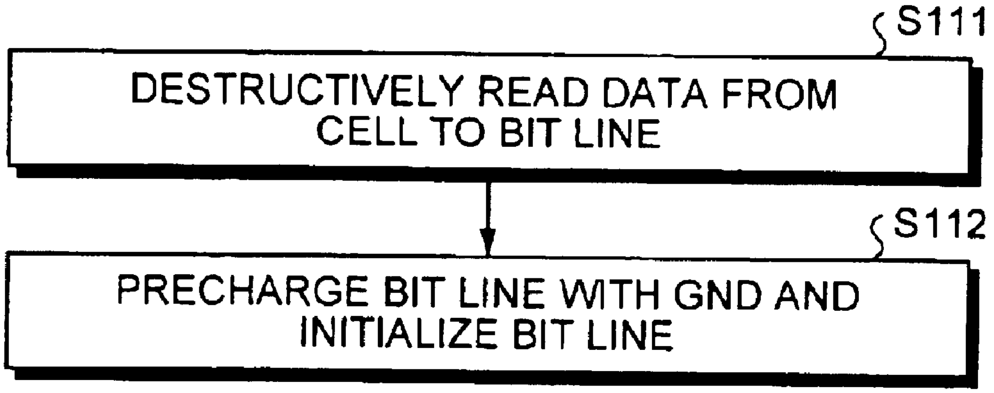
FIG. 19 is a flow chart that shows the processing of the semiconductor memory device according to the present invention when read data is not output to the outside and data is not restored.

The operation of the memory device 20 for not outputting the data read from the memory device 20 to the outside and destroying the data in the memory area from which the data is read (which operation is referred to as "Case 2" hereinafter) is explained. As shown in FIG. 19, the Case 2 has the following sequence. Data is read from a memory cell to the bit line (at step S11). Right after reading the data, the bit line is pre-charged with the ground potential and thereby initialized while keeping the electric potential of the plate line high (at step S112).

Figure 20:
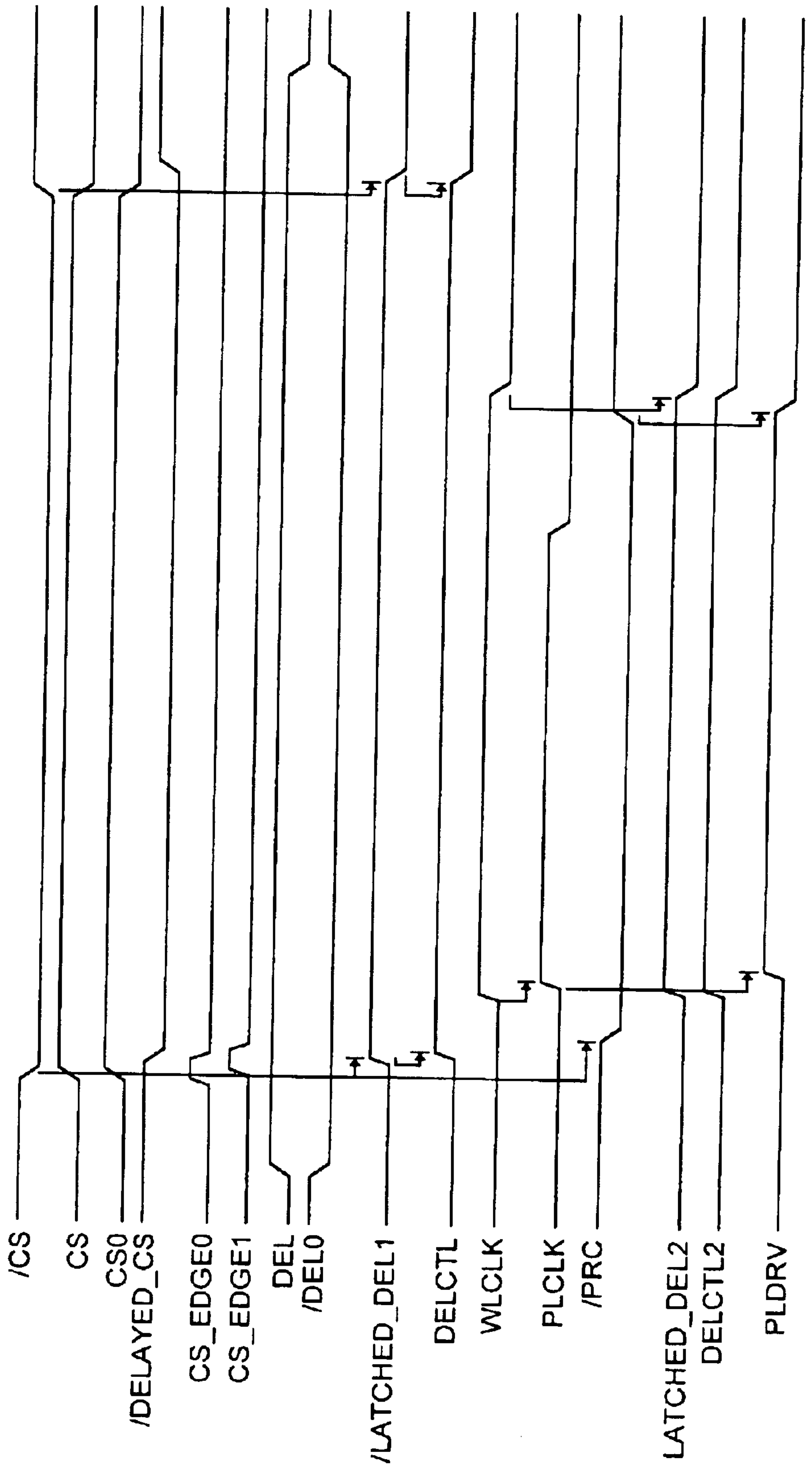
FIG. 20 is a timing diagram that shows the processing of the semiconductor memory device according to the present invention when read data is output to the outside and data is not restored.
Figure 21:
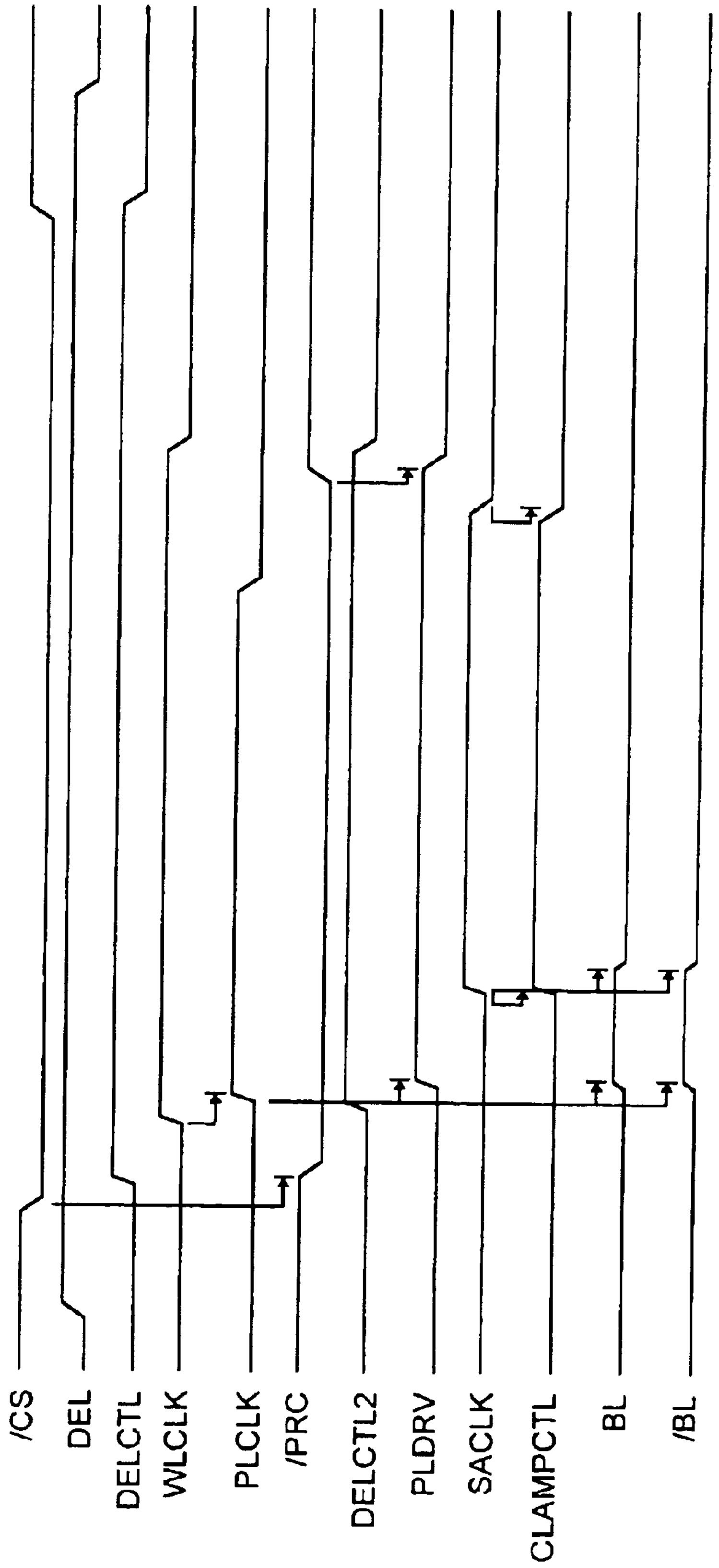
FIG. 21 is a timing diagram that shows the processing of the semiconductor memory device according to the present invention when read data is not output to the outside and data is not restored.

The operation timings of the Case 2 is explained. FIG. 20 is a timing diagram of the Case 2 for the bit line related signals (see FIGS. 11, 13, and 14 for the explanation of the various control signals). As shown in FIGS. 20 and 21, the data destructive signal DEL is changed from L level to H level. Thereafter, the chip select signal /CS, which is low active, is changed from H level to L level.

Accordingly, the data destructive signal latch circuit 50 latches the H-level signal /LATCHED__DEL1, so that the read operation control signal DELCTL is changed from L level to H level. Further, the pre-charge signal /PRC is changed from H level to L level. The word line driving clock signal WLCLK, the conventional plate line driving signal PLCLK, and the new plate line driving signal PLDRV remain L level.

The word line driving clock signal WLCLK is then changed to H level, and the H-level data destructive signal LATCHED__DEL2 is latched. The conventional plate line driving signal PLCLK is changed to H level, and the new plate line driving signal PLDRV is also changed to H level. Data is then read to the bit line BL or /BL.

While the conventional sense amplifier driving signal SACLK and the clamp control signal CLAMPCTL have been at L level so far, the conventional sense amplifier driving signal SACLK is changed to H level. Accordingly, the clamp control signal CLAMPCTL is changed to H level. As a result, the bit lines BL and /BL are clamped to the ground potential.

Thereafter, the conventional plate line driving signal PLCLK is changed to L level, and the conventional sense amplifier driving signal SACLK and the clamp control signal CLAMPCTL are returned to L level. The pre-charge signal /PRC is then returned to H level, and the new plate line driving signal PLDRV is returned to L level. In the Case 2 operation similarly to the Case 1, the bit line is initialized before the electric potential of the plate line is lowered, so that data is not restored.

Thereafter, the word line driving clock signal WLCLK is changed to L level. The chip select signal /CS is returned to H level. Accordingly, the H-level signal /LATCHED__DEL1 latched by the data destructive signal latch circuit 50 is reset to L level, so that the read operation control signal DELCTL is also reset to L level. The data destructive signal DEL is returned to L level, thus finishing the Case 2 operation.

Figure 22:
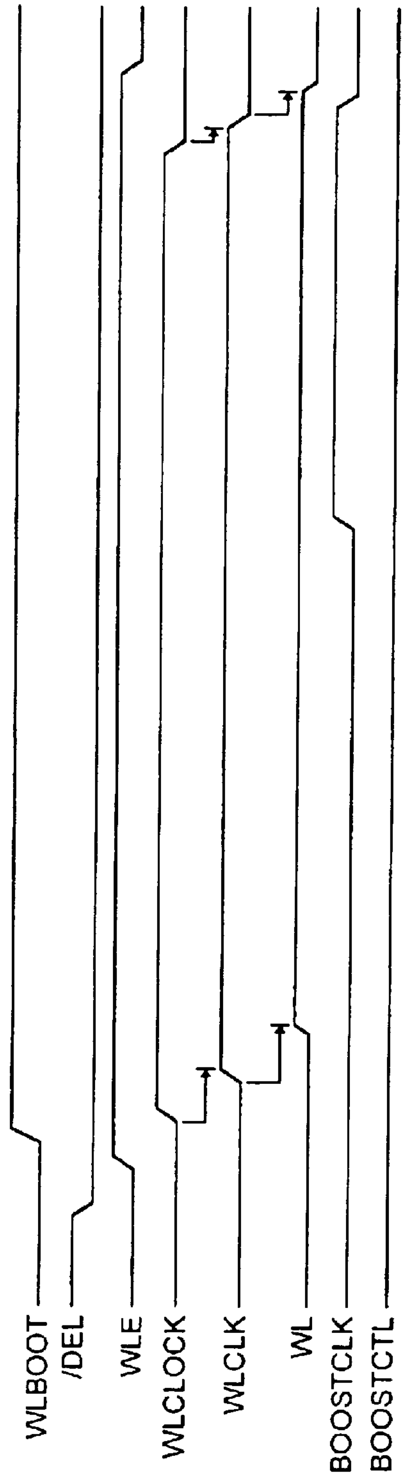
FIG. 22 is a timing diagram for the processing of the semiconductor memory device according to the present invention when the voltage of word line is not boosted.

In the Case 1 and Case 2 operations, the data destructive signal DEL becomes H level and the inverted signal /DEL of the data destructive signal DEL thereby becomes L level as shown in FIG. 22. Therefore, after the data is read to the bit line, the signal BOOSTCLK for boosting the voltage of the word line (WL) becomes H level whereas the new signal BOOSTCTL for boosting the voltage of the word line (WL) remains L level (see FIG. 16). Thus, the electric potential of the capacitor 4 connected to the word line (WL) is not raised, so that the voltage of the word line (WL) is not boosted.

Figure 23:
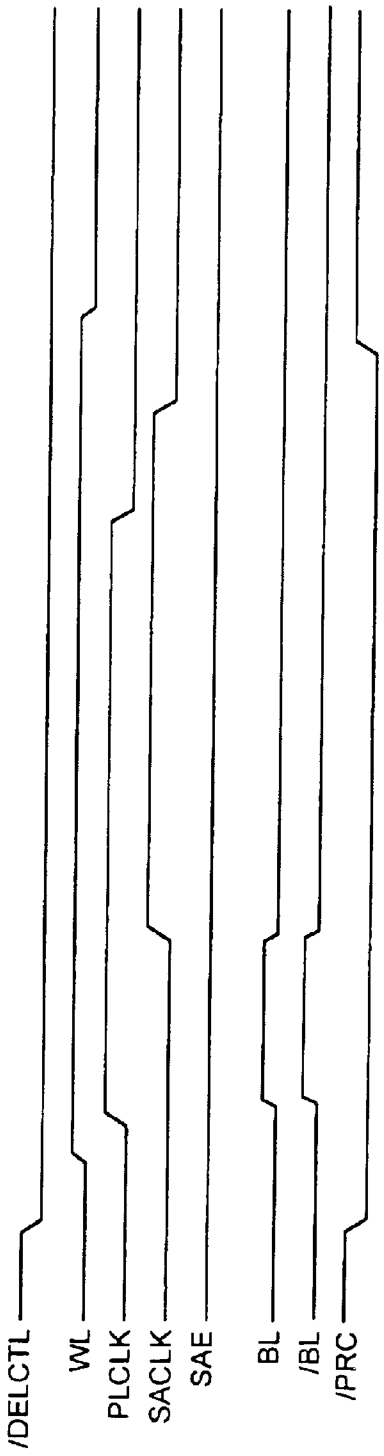
FIG. 23 is a timing diagram for the processing of the semiconductor memory device according to the present invention when a sense amplifier is not actuated.

In the Case 2 operation, as shown in FIG. 23, the read operation control signal DELCTL becomes H level and the inverted signal /DELCTL of the signal DELCTL thereby becomes L level. Therefore, during data read, the conventional sense amplifier driving signal SACLK becomes H level whereas the sense amplifier enable signal SAE remains L level (see FIG. 15). Thus, the sense amplifier is not driven.

Figure 1:
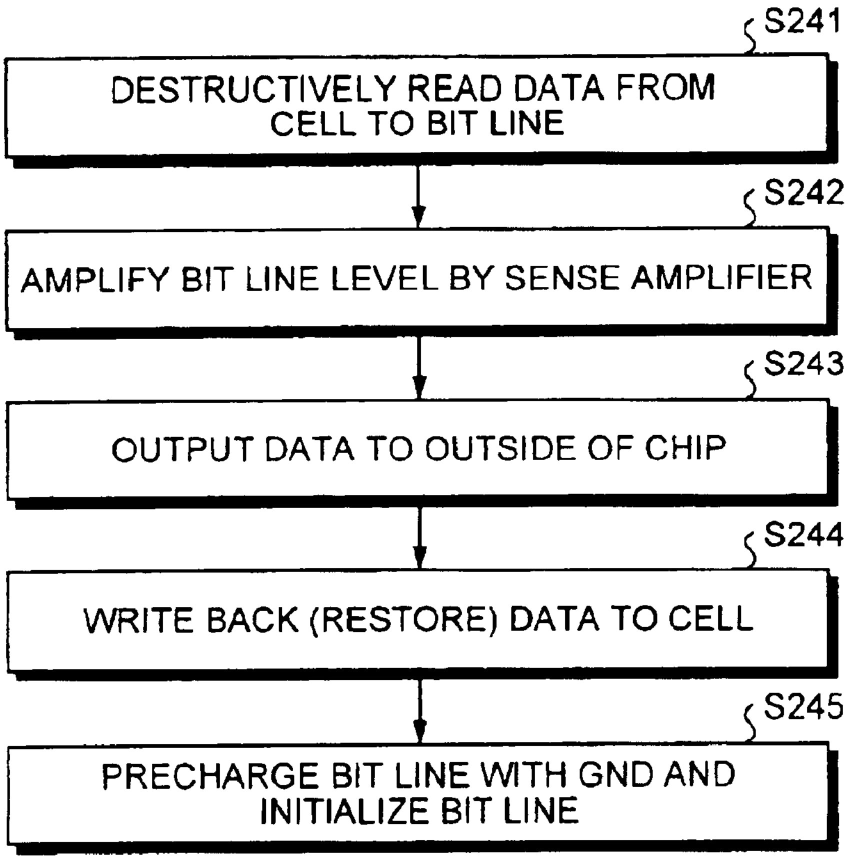
FIG. 1 is a flow chart that shows the data read processing of a conventional FeRAM.
Figure 2:
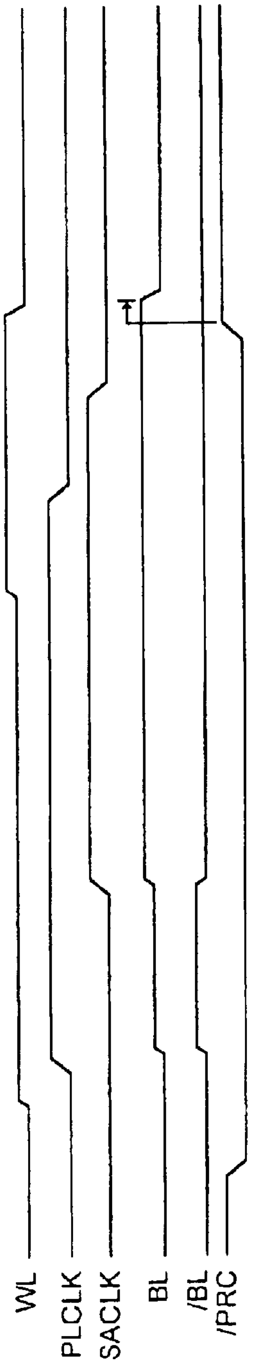
FIG. 2 is a timing diagram for the data read processing of the conventional FeRAM.
Figure 24:
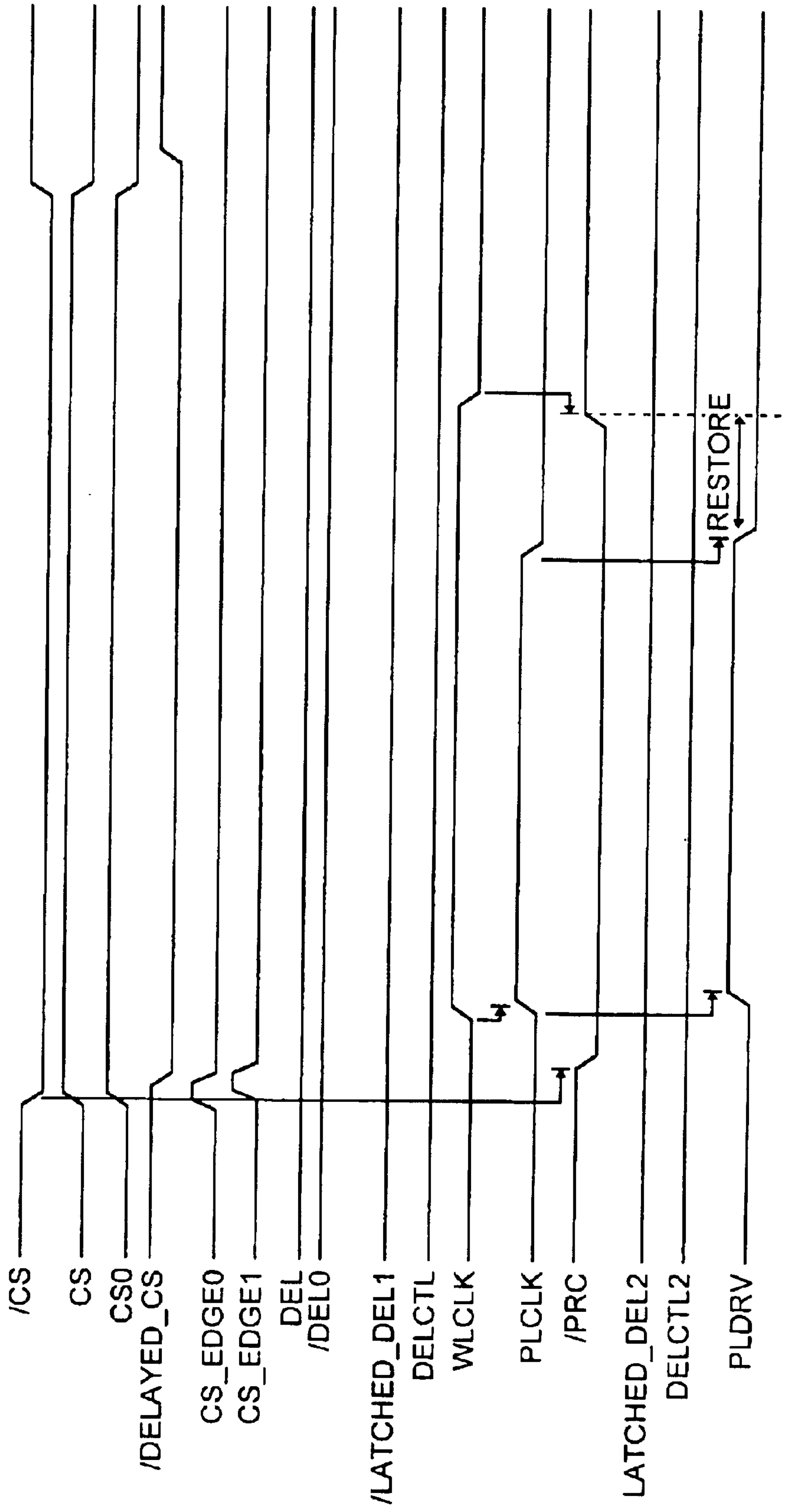
FIG. 24 is a timing diagram that shows the processing of the semiconductor memory device according to the present invention when read data is output to the outside and data is restored.

The operation of the memory device 20 for outputting the data read from the memory device 20 to the outside and writing back data to the memory area from which the data is read, i.e., the ordinary operation of the memory device 20 is explained. This operation has the same processing sequence as the conventional processing sequence shown in FIG. 1. FIG. 24 is a timing diagram of the ordinary operation (see FIGS. 11 and 13 for the explanation of the various signals). As shown in FIG. 24, the chip select signal /CS, which is low active, is changed from H level to L level, and the pre-charge signal /PRC is changed from H level to L level.

The word line driving clock signal WLCKL is then changed to H level. Accordingly, the conventional plate line driving signal PLCLK and the new plate line driving signal PLDRV are changed to H level, and data read is performed. When the data read is finished, the conventional plate line driving signal PLCLK is changed to L level and the new plate line driving signal PLDRV is returned to L level, accordingly. The voltage of the word line is boosted, thus writing back the destroyed data.

Thereafter, the pre-charge signal /PRC is returned to H level. The word line driving clock signal WLCLK is changed to L level, and the chip select signal /CS is returned to H level, thus finishing the ordinary operation. During this ordinary operation, the data destructive signal DEL and the read operation control signal DELCTL remain L level.

Figure 7:
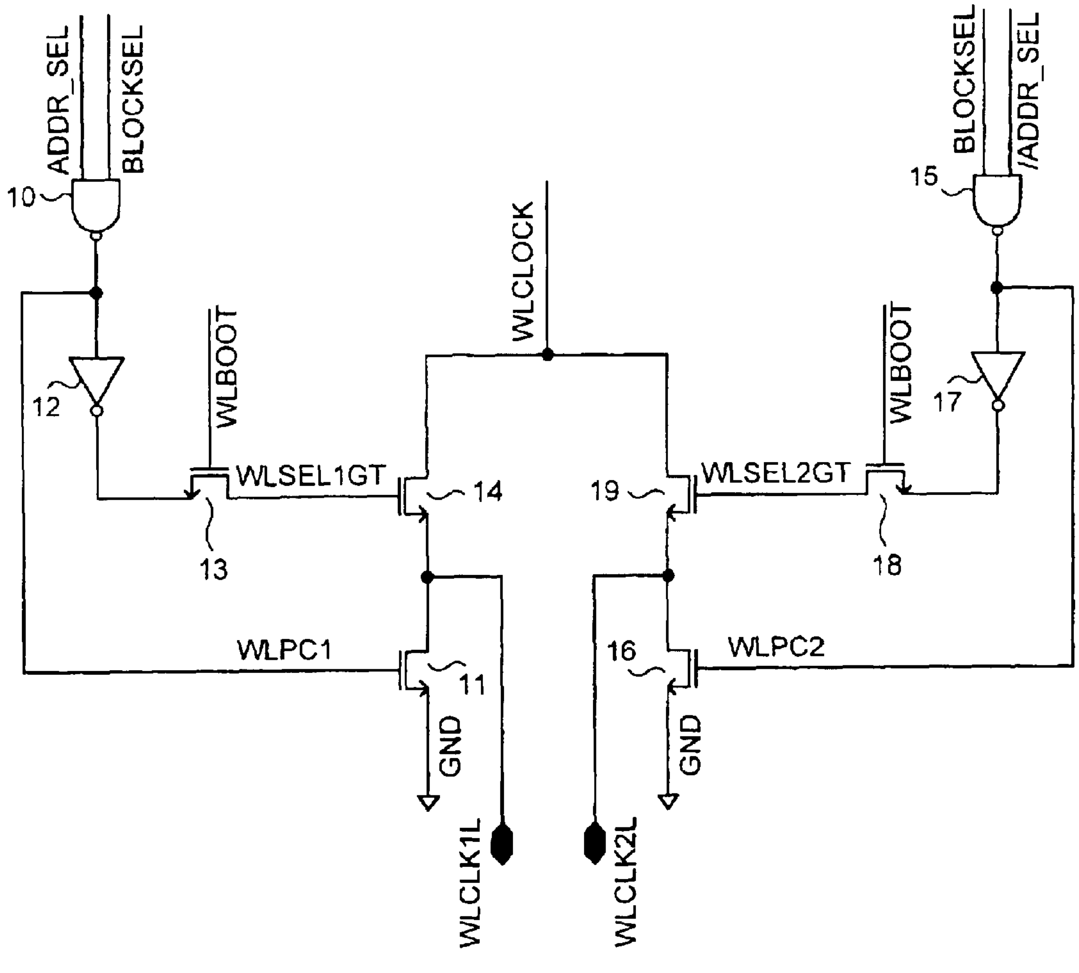
FIG. 7 is a circuit diagram that shows the configuration of a circuit that controls word line selection in the conventional plate line shared type FeRAM.
Figure 8:
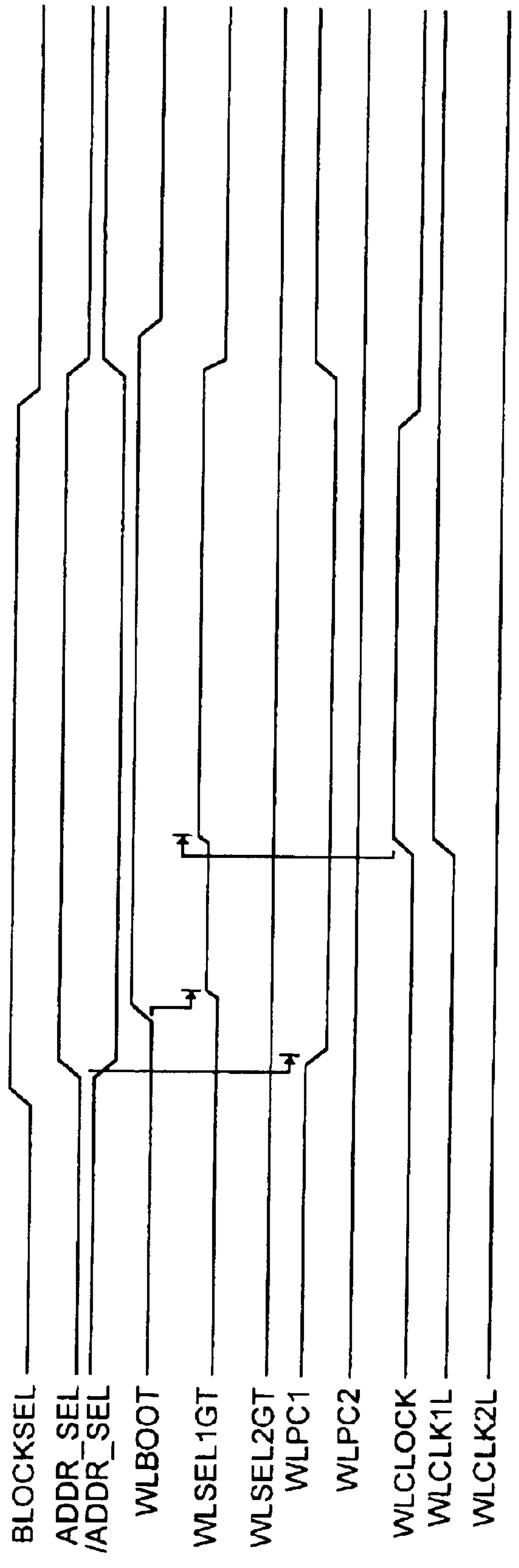
FIG. 8 is a timing diagram that shows the operation of the circuit shown in FIG. 7.
Figure 25:
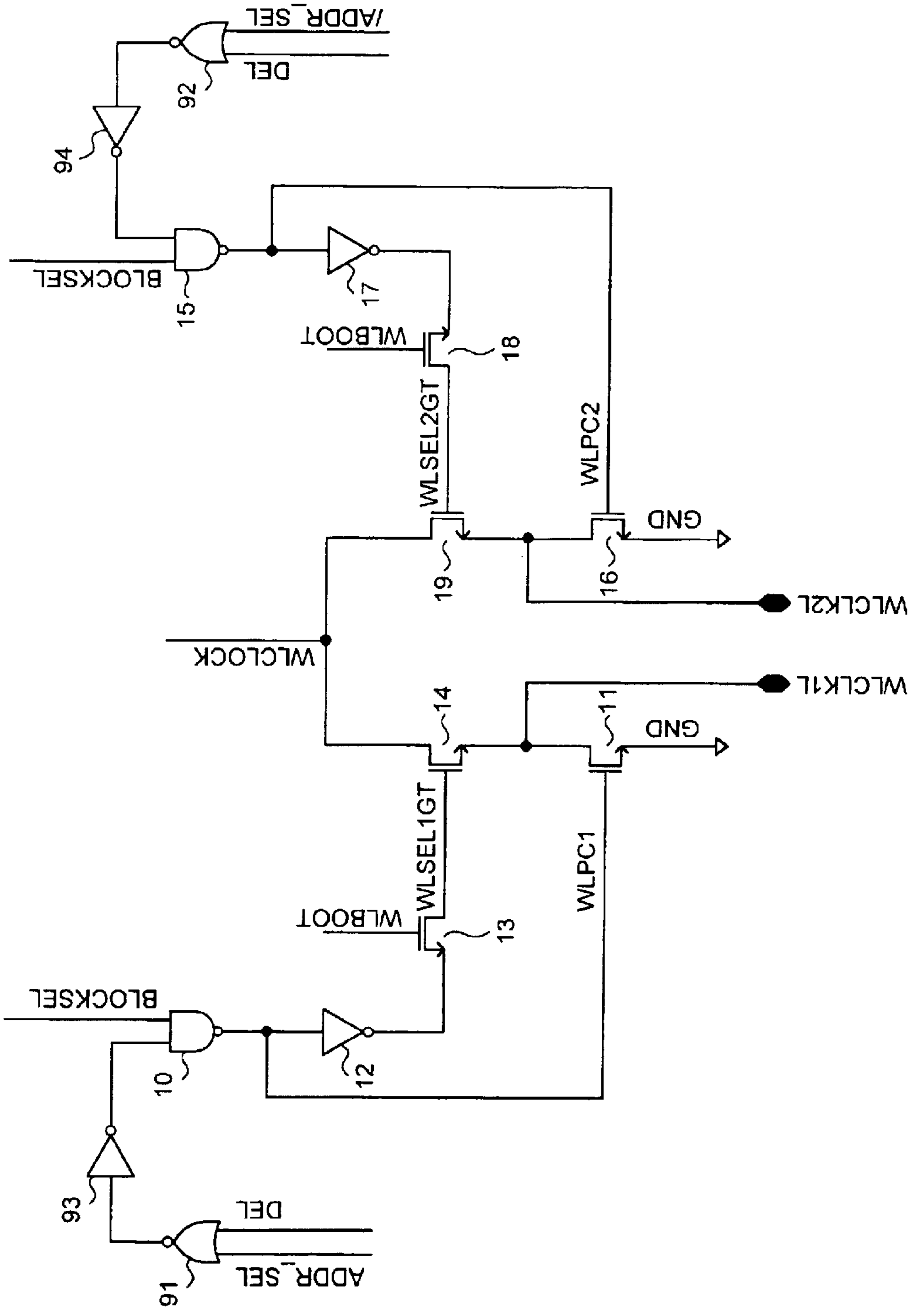
FIG. 25 is a circuit diagram that shows the configuration of a circuit that controls word line selection when the semiconductor memory device according to the present invention is applied to a plate line shared type FeRAM.
Figure 26:
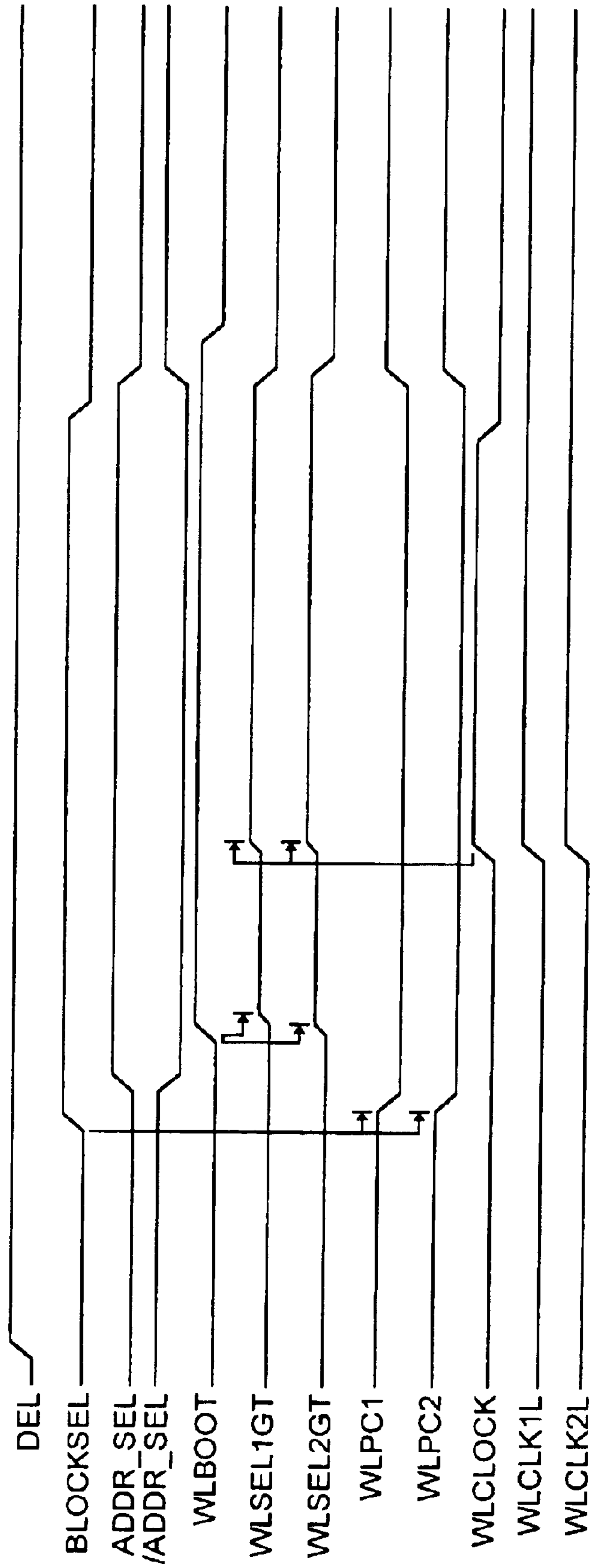
FIG. 26 is a timing diagram that shows the operation of the circuit shown in FIG. 25.

FIG. 25 is a circuit diagram that shows the configuration of a circuit that controls word line selection when the present invention is applied to the plate line shared type FeRAM. FIG. 26 is a timing diagram that shows the operation of the circuit shown in FIG. 25. As shown in FIG. 25, this circuit includes two NOR gates 91 and 92, and two inverters 93 and 94 as well as the constituent elements of the conventional circuit (see FIG. 7). In FIG. 25, the same constituent elements as those shown in FIG. 7 are denoted by the same reference symbols, and is not explained herein.

The address select signal ADDR__SEL and the data destructive signal DEL are input into one NOR gate 91. The output signal of the NOR gate 91 is inverted by the inverter 93, and the inverted signal as well as the block select signal BLOCKSEL is input into the first NAND gate 10. The inverted signal /ADDR__SEL of the address select signal ADDR__SEL and the data destructive signal DEL are input into the other NOR gate 92. The output signal of the NOR gate 92 is inverted by the inverter 94, and the inverted signal as well as the block select signal BLOCKSEL is input into the second NAND gate 15.

As shown in FIG. 26, when the data destructive signal DEL becomes H level and the block select signal BLOCKSEL becomes H level, the output signal of the first NAND gate 10, i.e., a gate input signal WLPC1 input into the gate of the first NMOS transistor 11 becomes L level, irrespective of the address select signal ADDR__SEL. Therefore, the first NMOS transistor 11 is turned off.

The output signal of the first NAND gate 10 is inverted by the first inverter 12, and input into the gate of the third NMOS transistor 14 through the second NMOS transistor 13 as an H-level gat signal WLSEL1GT, thus turning on the third NMOS transistor 14. Accordingly, the first word line driving signal WLCLK1L becomes VDD Level.

On the other hand, while the inverted signal /ADDR__SEL of the address select signal ADDR__SEL becomes L level, the output signal of the second NAND gate 15 becomes L level, irrespective of the potential level of the inverted signal /ADDR__SEL. The circuit configuration in which the second word line driving signal WLCLK2L is output from the second NAND gate 15 is the same as that in which the first word line driving signal WLCLK1L is output from the first NAND gate 10. Therefore, the second word line driving signal WLCLK2L becomes VDD level, as well. In other words, a pair of word lines that share one plate line are simultaneously selected. Therefore, the NOR gates 91 and 92, and the inverters 93 and 94 function as a multiple-select unit. By thus performing the word line multiple selection, it is possible to destroy the data in the same block at a rate twice as high as that for the configuration in which a word line correspond to a plate line by a one-to-one correspondence.

Figure 27:
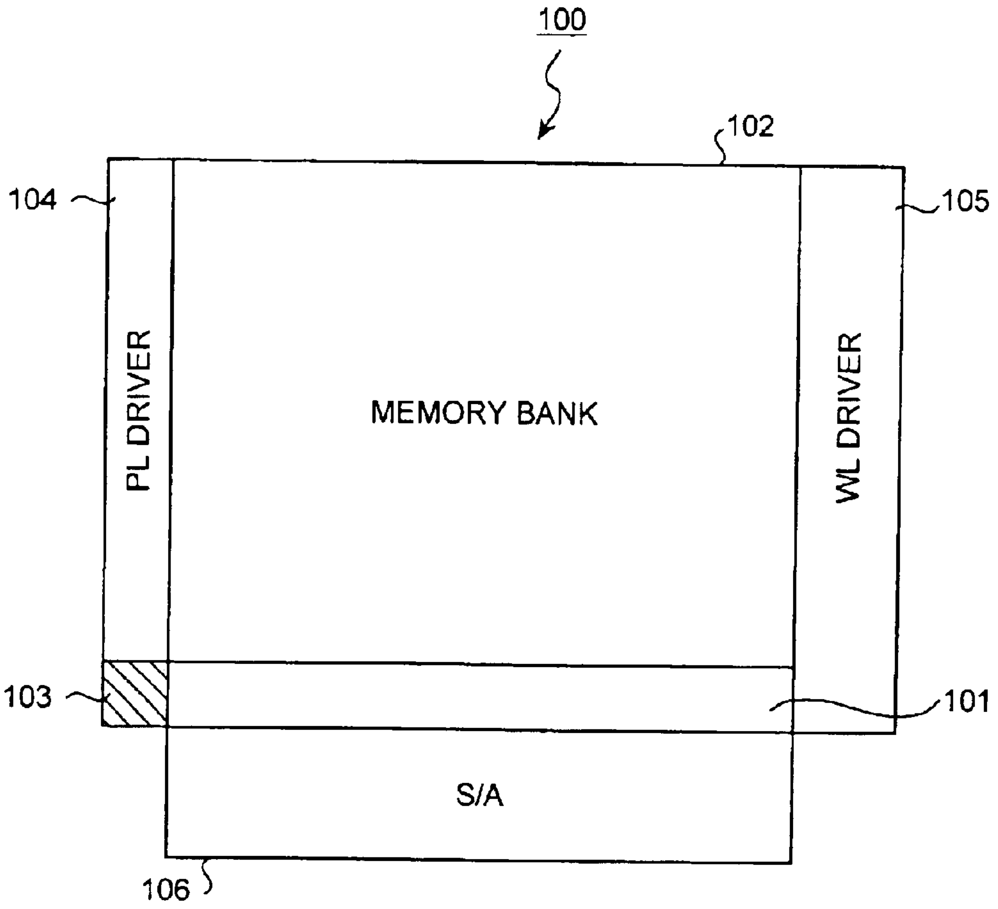

FIG. 27 is a typical diagram that shows an example in which the present invention is applied to the realization of the function of restricting an effective access frequency or the like. To realize this function, the memory device is shipped while data is written to a predetermined block 101 in the memory area 100 in advance. Whenever data is read on an end user side, data in the block 101 to which the data is written is read one by one, and destroyed without being restored. The operation of a plate line driving circuit 103 for the block 101 to which access restricted data is written, is the same as the Case 1 operation. In addition, a plate line driving circuit (PL driver) 104 for a memory area (memory bank) 102 used as an ordinary data area is the same as the conventional circuit. In FIG. 27, reference symbol 105 denotes a word line driving circuit (WL driver) and 106 denotes a sense amplifier (S/A).

Figure 28:
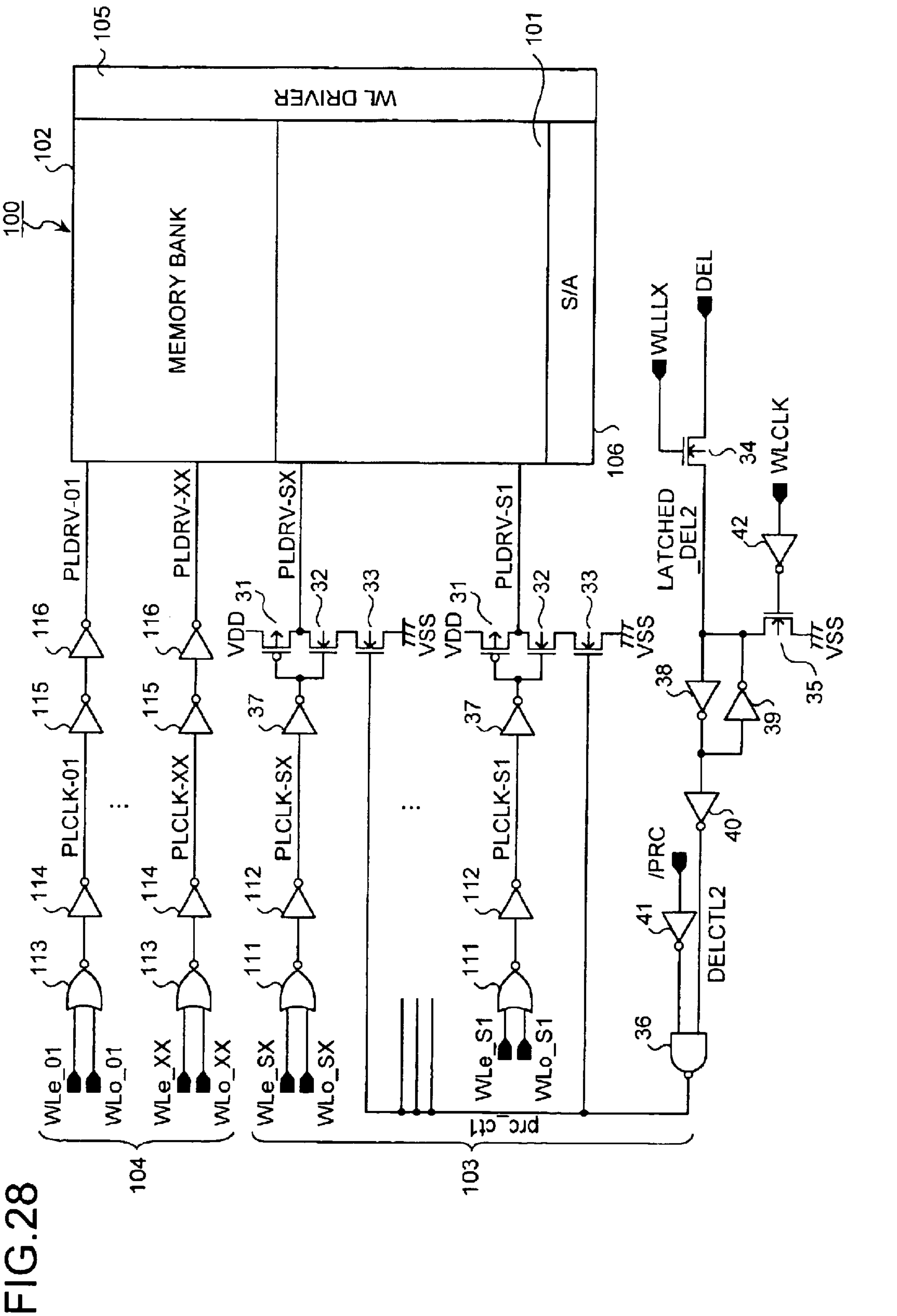
FIG. 28 is a circuit diagram that shows the detailed configuration of a plate line driving circuits in the configuration shown in FIG. 27.

FIG. 28 is a circuit diagram that shows the detailed configuration of the plate line driving circuit 103 for the block 101 to which the access restricted data is written and that of the plate line driving circuit 104 for the memory area 102 used as an ordinary data area. The driving circuits for driving the individual plate lines in the plate line driving circuit 103 for the block 101 to which the access restricted data is written, are the same as the plate line driving circuit (PLCTL) 30 shown in FIG. 11. In FIG. 28, the same constituent elements as those shown in FIG. 11 are denoted by the same reference symbols, and is not explained herein.

In the plate line driving circuit 103 for the block 101 to which the access restricted data is written, conventional plate line driving signals PLCLK_SX to PLCLK_S1 are generated by a circuit that consists of a NOR gate 111 and an inverter 112. Based on the conventional plate line driving signals PLCLK_SX to PLCLK_S1, new plate line driving signals PLDRV_SX to PLDRV_S1 are generated.

In the plate line driving circuit 104 for the memory area 102 used as an ordinary data area, conventional plate line driving signals PPLCLK_01 to PLCLK_XX are generated by a circuit that consists of a NOR gate 113 and an inverter 114, and respectively inverted twice by two inverters 115 and 116, thus outputting new plate line driving signals PLDRV_01 to PLDRV_XX.

Figure 29:
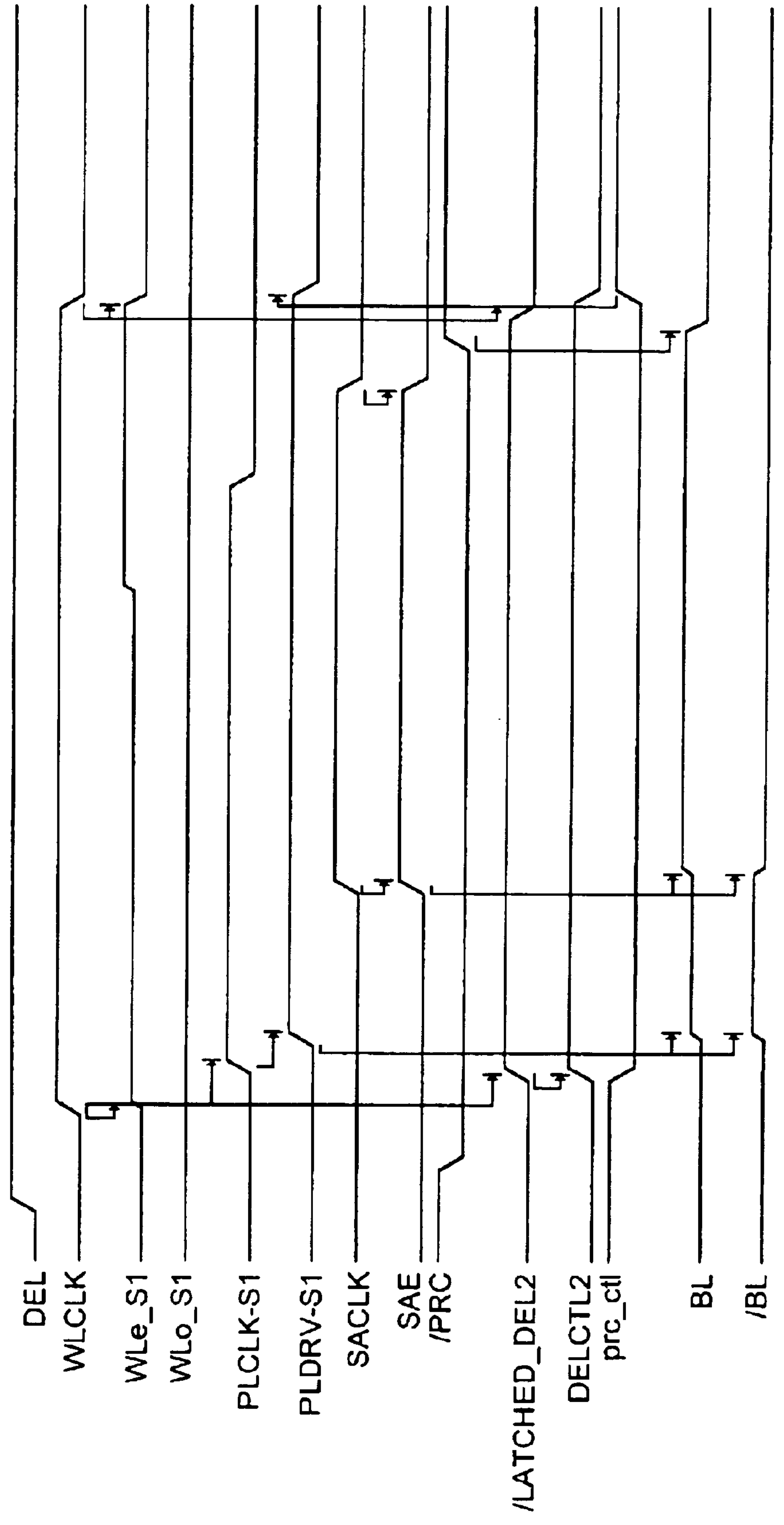
FIG. 29 is a timing diagram for the processing of the circuit shown in FIG. 28 when read data from a block to which access restricted data is written, is output to the outside and data is not restored.

FIG. 29 is a timing diagram that shows the processing for outputting the data read from the block 101, to which the access restricted data is written, to the outside and not restoring data, in respect of "S1"—added signals to discriminate the signals from those related to the other plate lines. Similarly to the diagram shown in FIG. 18, the new plate line driving signal PLDRIV_S1 is returned to L level after the bit line BL is pre-charged with the ground potential, so that data is not restored. As a result, an effective frequency for access or the like is decreased by one.

Figure 30:
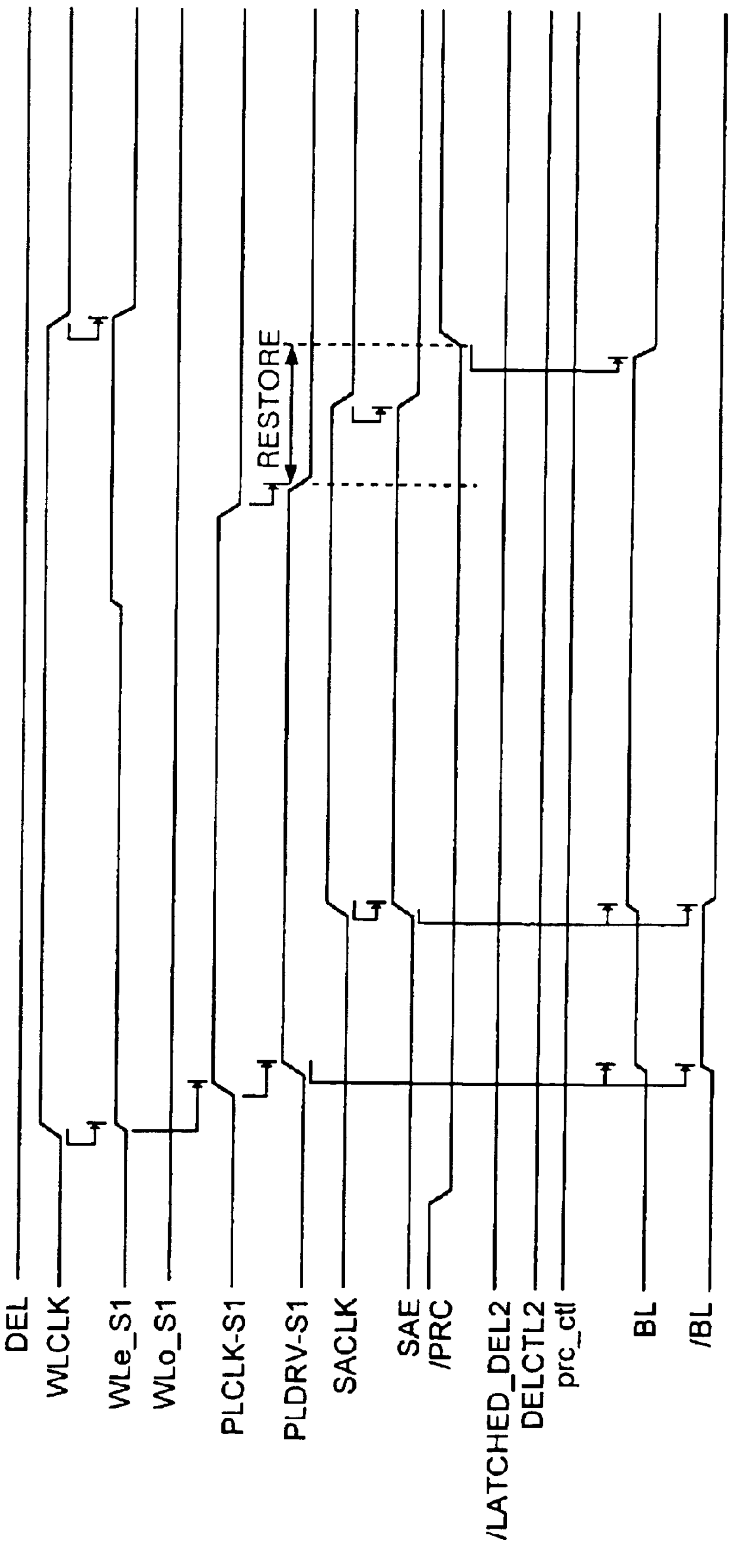
FIG. 30 is a timing diagram for the processing of the circuit shown in FIG. 28 when read data from the block to which access restricted data is written, is output to the outside and data is restored.

FIG. 30 is a timing diagram which shows the processing for outputting the data read from the block 101, to which the access restricted data is written, to the outside and restoring data. The block 101 to which the access restricted data is written is used to store the access restricted data in advance as explained above. In addition, the block 101 can be used in the same manner as the memory area for ordinary data restore. That is, FIG. 30 is a timing diagram if the block 101 is used as an ordinary memory area. Similarly to the diagram of FIG. 24, after the new plate line driving signal PLDRV_S1 is returned to L level, data is restored while the bit line BL is pre-charged with the ground potential.

Figure 31:
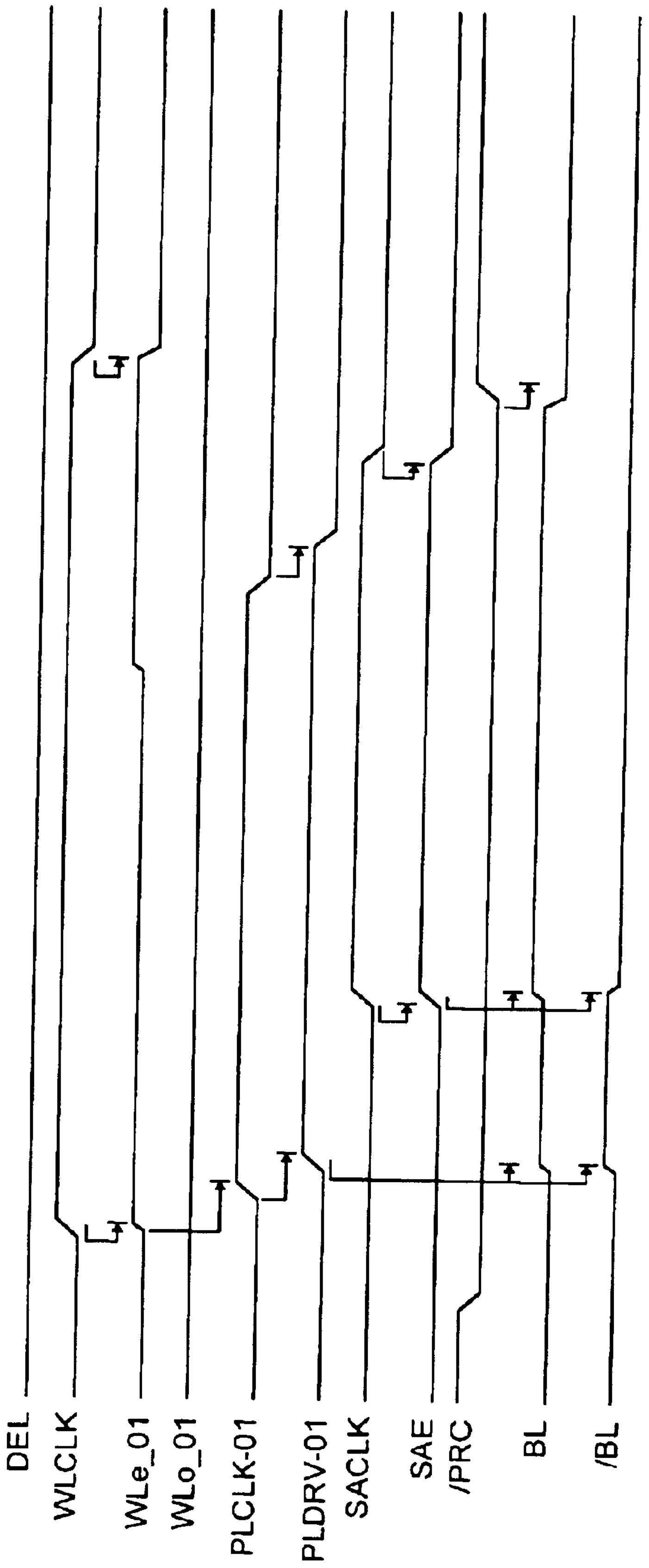
FIG. 31 is a timing diagram for the processing of the circuit shown in FIG. 28 when read data from a memory area used as an ordinary data area is output to the outside and data is restored.

FIG. 31 is a timing diagram which shows the processing for outputting the data read from the memory area 102 used as an ordinary data area, to the outside and restoring data in respect of "01"—added signals to discriminate them from the other plate line signals. Similarly to the diagram of FIG. 24, after the new plate line driving signal PLDRV_S1 is returned to L level, data is restored while the bit line BL is pre-charged with the ground potential.

In the embodiment explained so far, the data is not written back after the data read operation. Therefore, the data destroyed by the data read operation remains destroyed even after the data read operation, making it possible to easily destroying unnecessary data used during an operation for the application or the like. In addition, the data is destroyed without overwriting the data, making it possible to stop boosting the voltage of the word line. In addition, when the read data is not output to the outside of the memory device, the operation of the sense amplifier can be stopped, making it possible to suppress the power consumption of the memory device during data destruction.

The present invention is not limited to the embodiment explained so far, but various changes and modifications can be made to the present invention. For example, when the data read from the memory device 20 is not output to the outside, the electric potential of the bit line may be turned into a floating state instead of clamping the electric potential of the bit line to the ground potential.

According to the present invention, data in a memory area from which data is read, is destroyed by a data read operation; however, the destroyed data is not written back after the read operation. Therefore, the data in the memory area remains destroyed. It is, therefore, possible to easily destroying unnecessary data used during an operation for an application or the like. According to the present invention, when data is destroyed, it is unnecessary to overwrite data. Therefore, it is possible to stop boosting the voltage of the word line and stop the operation of the sense amplifier. It is thereby possible to suppress power consumption during the data destruction.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor memory device comprising:

a memory block including a ferroelectric memory;

a peripheral circuit that controls access to the memory block; and a data destruction unit that stops an operation for writing back destructed data to an area of the memory block in which data is destructed by a data read operation for the memory block, wherein the data destruction unit includes a plate line control circuit that lowers an electric potential of a plate line after a bit line is pre-charged with a ground potential.

2. The semiconductor memory device according to claim 1, further comprising:

a switching unit for determining from an outside whether the plate line control circuit should lower the electric potential of the plate line before the bit line is pre-charged with the ground potential or after the bit line is pre-charged with the ground potential.

3. The semiconductor memory device according to claim 2, wherein the switching unit is operated in response to a control signal input from the outside.

4. A semiconductor memory device comprising:

a memory block including a ferroelectric memory;

a peripheral circuit that controls access to the memory block; and a data destruction unit that stops an operation for writing back destructed data to an area of the memory block in which data is destructed by a data read operation for the memory block; and a boost stopping unit that stops an operation for boosting a voltage of the word line to a write voltage while the plate line control circuit lowers the electric potential of the plate line after the bit line is pre-charged with the ground potential.

5. The semiconductor memory device according to claim 4, wherein the boost stopping unit is a boost control circuit that controls an electric potential of a coupling capacitance connected to the word line.

6. The semiconductor memory device according to claim 4, further comprising:

a switching unit that determines from the outside whether the boost control circuit stops boosting the voltage of the word line.

7. The semiconductor memory device according to claim 6, wherein the switching unit is operated in response to a control signal input from the outside.

8. A semiconductor memory device comprising:

a memory block including a ferroelectric memory;

a peripheral circuit that controls access to the memory block;

a data destruction unit that stops an operation for writing back destructed data to an area of the memory block in which data is destructed by a data read operation for the memory block; and a data output stopping unit that stops output of the data read from the memory block to the outside.

9. The semiconductor memory device according to claim 8, wherein the data output stopping unit is a clamp circuit that clamps the bit line to a predetermined potential.

10. The semiconductor memory device according to claim 9, further comprising:

a switching unit that determines whether the clamp circuit is to clamp the bit line with the predetermined potential from the outside.

11. The semiconductor memory device according to claim 10, wherein the switching unit is operated in response to a control signal input from the outside.

12. The semiconductor memory device according to claim 8, further comprising:

a sensing stopping unit that stops an operation of a sense amplifier for amplifying the electric potential of the bit line.

13. The semiconductor memory device according to claim 12, further comprising:

a switching unit that determines whether the sensing stopping unit is to stop the operation of the sense amplifier, from the outside.

14. The semiconductor memory device according to claim 13, wherein the switching unit is operated in response to a control signal input from the outside.

15. A semiconductor memory device comprising:

a memory block including a ferroelectric memory;

a peripheral circuit that controls access to the memory block;

a data destruction unit that stops an operation for writing back destructed data to an area of the memory block in which data is destructed by a data read operation for the memory block; and a multiple-select unit that simultaneously raises potentials of two word lines having a combination with a same plate line.

16. The semiconductor memory device according to claim 15, wherein the multiple-select unit comprises a switching unit that determines from the outside whether to simultaneously raise the potentials of the two word lines having a combination with the same plate line.

17. The semiconductor memory device according to claim 16, wherein the switching unit is operated in response to a control signal input from the outside.

18. A semiconductor memory device comprising:

a memory block including a ferroelectric memory;

a peripheral circuit that controls access to the memory block;

a data destruction unit that stops an operation for writing back destructed data to an area of the memory block in which data is destructed by a data read operation for the memory block, wherein the data destruction unit includes a plate line control circuit that lowers an electric potential of a plate line after a bit line is pre-charged with a ground potential;

a first switching unit that determines from an outside whether the plate line control circuit should lower the electric potential of the plate line before the bit line is pre-charged with the ground potential or after the bit line is pre-charged with the ground potential, wherein the first switching unit is operated in response to a first control signal input from the outside;

a boost stopping unit that stops an operation for boosting a voltage of the word line to a write voltage while the plate line control circuit lowers the electric potential of the plate line after the bit line is pre-charged with the ground potential;

a second switching unit that determines from the outside whether the boost control circuit stops boosting the voltage of the word line, wherein the second switching unit is operated in response to a second control signal input from the outside;

a data output stopping unit that stops output of the data read from the memory block to the outside, wherein the data output stopping unit is a clamp circuit that clamps the bit line to a predetermined potential;

a third switching unit that determines whether the clamp circuit is to clamp the bit line with the predetermined potential from the outside, wherein the third switching unit is operated in response to a third control signal input from the outside;

a sensing stopping unit that stops an operation of a sense amplifier for amplifying the electric potential of the bit line;

a fourth switching unit that determines whether the sensing stopping unit is to stop the operation of the sense amplifier, from the outside, wherein the fourth switching unit is operated in response to a fourth control signal input from the outside; and a multiple-select unit that simultaneously raises potentials of two word lines having a combination with a same plate line, wherein the multiple-select unit comprises a fifth switching unit that determines from the outside whether to simultaneously raise the potentials of the two word lines having a combination with the same plate line, wherein the fifth switching unit is operated in response to a fifth control signal input from the outside, wherein the first control signal, the second control signal, the third control signal, the fourth control signal, and the fifth control signal are same signals.

19. A semiconductor memory device comprising:

a memory block including a ferroelectric memory;

a peripheral circuit that controls access to the memory block; and a data destruction unit that destructs data stored in an area in the memory block by reading the data and stops writing back the data to the area.

20. A semiconductor memory device comprising:

a memory block, including a ferroelectric memory;

a peripheral circuit that controls access to the memory block; and a data destruction unit that destructs data stored in an area in the memory block by reading the data and stops restoring the data to the area.

* * * * *